(12) United States Patent
Shirasuna et al.

(10) Patent No.: US 6,391,394 B1
(45) Date of Patent: *May 21, 2002

(54) METHOD FOR MANUFACTURING ELECTROPHOTOGRAPHIC PHOTOSENSITIVE MEMBER AND JIG USED THEREIN

(75) Inventors: Toshiyasu Shirasuna; Yoshio Segi; Hiroyuki Katagiri, all of Nara (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/999,456

(22) Filed: Dec. 29, 1997

Related U.S. Application Data

(63) Continuation of application No. 08/361,038, filed on Dec. 21, 1994, now abandoned.

(30) Foreign Application Priority Data

Dec. 22, 1993 (JP) ................................................ 5-325154
Dec. 8, 1994 (JP) ............................................. 6-304453

(51) Int. Cl.$^7$ ............................ H05H 1/46; H05H 1/24; B08B 3/12; B08B 3/04; G03G 5/085
(52) U.S. Cl. ........................ 427/569; 427/575; 427/573; 427/574; 427/578; 134/29; 134/40; 134/34; 430/127
(58) Field of Search ................................. 427/560, 563, 427/573, 574, 575, 578, 579, 309, 314, 315, 318, 569; 341/29, 30, 34, 36, 39, 40, 41; 136/243, 257, 258, 261; 430/69, 127, 128

(56) References Cited

U.S. PATENT DOCUMENTS 4,076,564 A    2/1978  Fisher .......................... 134/41

4,126,483 A    11/1978  Donakowski et al. .......... 134/29
4,225,397 A    9/1980  Napier ......................... 204/29

(List continued on next page.)

FOREIGN PATENT DOCUMENTS

JP    58-14841      1/1983
JP    60-000876     1/1985
JP    60-086276     5/1985

(List continued on next page.)

OTHER PUBLICATIONS

*The Oxford Dictionary Per Scientific Writers & Editors*, Clarenden Press. Oxford (1991—No Month)—excerpt p. 314.*
Perry et al., Chemical Engineer's Handbook, McGraw–Hill Book Co., Inc. 1963 (no month), excerpts from Chp. 14 and pp. 19–21 to 19–22.
R.C. Weast, ed. Handbook of Chemistry and Physics, 56th ed., CRC Press Inc.; 1975 (no month), p. 84; F–206, E–55 & 61.

(List continued on next page.)

*Primary Examiner*—Marianne Padgett
(74) *Attorney, Agent, or Firm*—Fitzpatrick, Cella, Harper & Scinto

(57) ABSTRACT

A method for manufacturing an electrophotographic photosensitive member in which an aluminum substrate is fitted on a substrate holder and a functional film comprising a non-monocrystalline material containing silicon atoms as the matrix is formed by low pressure chemical deposition on the surface of the substrate, which comprises surface of the substrate is cleaned with water in which carbon dioxide is dissolved, the substrate holder comprises a metal as the matrix and has formed ceramics at least on the inner surface. This method and a jig used therein make it possible to prevent fine image defects, thereby improving electrophotography characteristics, and to economically and stably manufacture electrophotographic photosensitive members which provide high quality images free from defects and unevenness.

50 Claims, 7 Drawing Sheets

U.S. PATENT DOCUMENTS

| | | | |
|---|---|---|---|
| 4,265,991 A | 5/1981 | Hirai et al. | 430/64 |
| 4,427,458 A | 1/1984 | Hasegawa et al. | 148/615 |
| 4,504,518 A | 3/1985 | Ovshinsky et al. | 427/38 |
| 4,619,729 A | 10/1986 | Johncock et al. | 156/606 |
| 4,699,799 A | 10/1987 | Kato | 427/37 |
| 4,702,934 A | 10/1987 | Ishihara et al. | 427/563 |
| 4,702,981 A | 10/1987 | Matsumoto et al. | 430/69 |
| 4,710,428 A | 12/1987 | Tomanizu et al. | 118/725 |
| 4,759,947 A | 7/1988 | Ishihara et al. | 427/563 |
| 5,079,031 A | 1/1992 | Yamazaki et al. | 427/570 |
| 5,091,208 A | 2/1992 | Pryor | 427/573 |
| 5,114,825 A | 5/1992 | Takiawa et al | 430/159 |
| 5,314,780 A | 5/1994 | Takei et al. | 430/65 |
| 5,336,371 A | 8/1994 | Chung et al. | 437/229 |
| 5,456,757 A | 10/1995 | Aruga | 118/723 E |
| 5,480,754 A | 1/1996 | Takei et al. | 430/65 |
| 6,083,896 A * | 7/2000 | Inbe et al. | 134/41 |
| 6,103,442 A * | 8/2000 | Katagiri et al. | 430/127 |
| 6,110,629 A * | 8/2000 | Ehara et al. | 430/69 |
| 6,248,177 B1 * | 6/2001 | Halbmaier | 134/36 |
| 6,251,847 B1 * | 6/2001 | Pierce et al. | 134/40 |
| 6,318,382 B1 * | 11/2001 | Katagiri et al. | 134/41 |
| 6,156,472 A1 * | 12/2001 | Segi et al. | 430/128 |

FOREIGN PATENT DOCUMENTS

| | | |
|---|---|---|
| JP | 60-186849 | 9/1985 |
| JP | 60-262936 | 12/1985 |
| JP | 61-171798 | 8/1986 |
| JP | 61-273551 | 12/1986 |
| JP | 61-283116 | 12/1986 |
| JP | 63-264764 | 11/1988 |
| JP | 1-130159 | 5/1989 |

OTHER PUBLICATIONS

Transl. of Japanese reference to Ide et al.: Kokai No. Sho 58–14841.

Transl. of Japanese reference to Tadokoro et al.: Kokai No. Hei 1–130159.

Webster's 9th New Collegiate Dictionary, exceprts p. 733, 1990 No Month.

E.M. Purcell, Electricity & Magnetism: Berkeley Physic Course, vol. 2 McGraw–Hill Book Co., N.Y. 1965 (no month), exceprts, pp. 114–117, chart inside back cover.

* cited by examiner

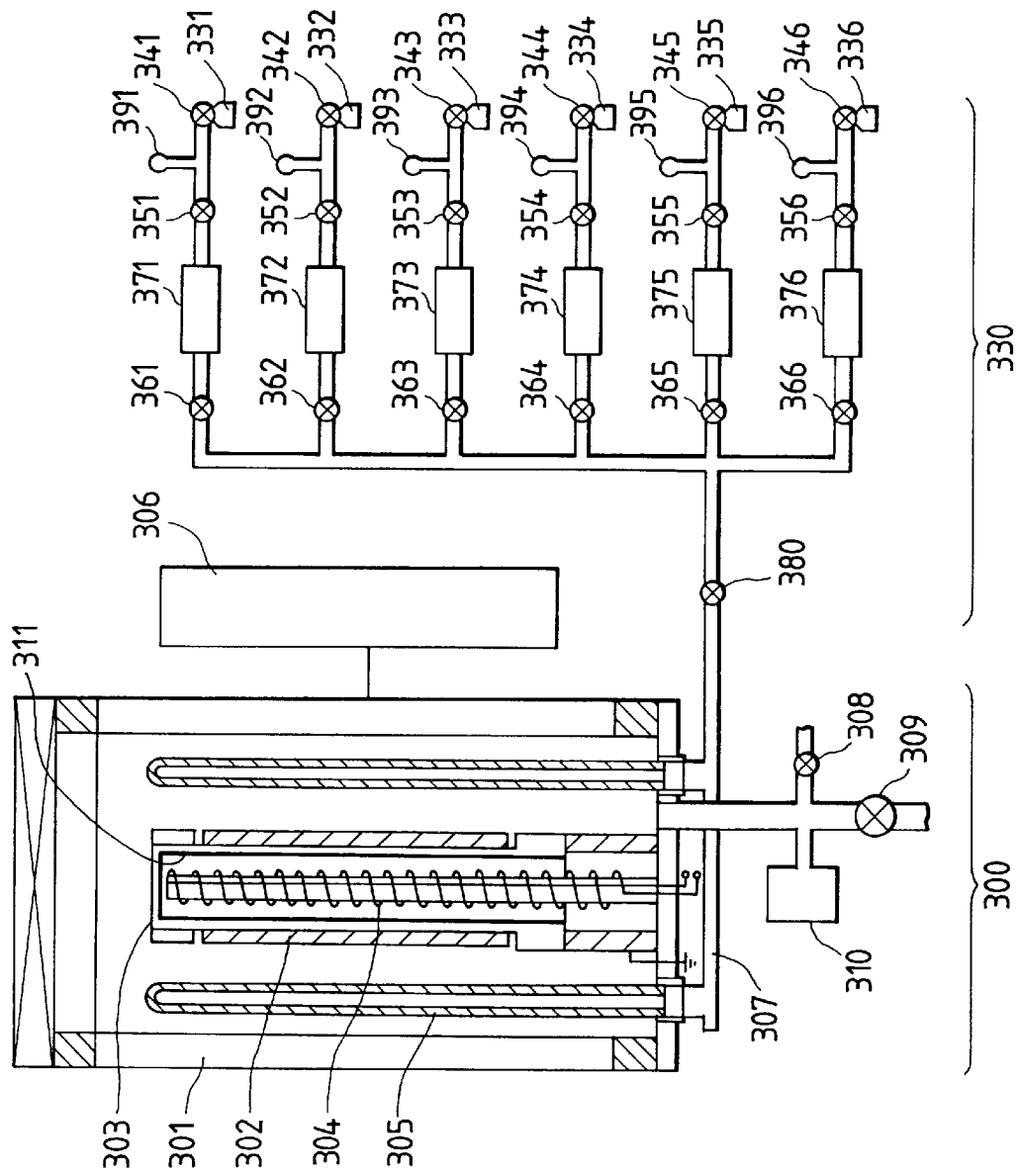

METHOD FOR MANUFACTURING ELECTROPHOTOGRAPHIC PHOTOSENSITIVE MEMBER AND JIG USED THEREIN

This application is a continuation of Ser. No. 08/361,038 filed Dec. 21, 1994, now abandoned.

BACKGROUND OF THE INVENTION

1. Field of the Invention

The present invention relates to a method of manufacturing an electrophotographic photosensitive member and a jig used therein. More specifically, the present invention relates to a method of manufacturing an electrophotographic photosensitive member, which has a non-monocrystalline deposited film comprising silicon atoms and hydrogen atoms formed on an aluminum substrate containing silicon atoms according to a plasma CVD method; the present invention also relates to a jig used in such method.

2. Related Background Art

As the substrate for formation of layer or layers to be deposited on an electrophotographic photosensitive member, glass, heat-resistant synthetic resin, stainless steel, and aluminum have been proposed. Metals have often been used from a practical point of view, however, because the substrate must be compatible with an electrophotographic process such as charging, exposure, development, transfer and cleaning and also because the exact position of the surface of the electrophotographic photosensitive member must always be maintained inside the main body of the apparatus with high accuracy in order to keep the image quality. Among many kinds of metal, aluminum is one of the most suitable materials for the substrate of electrophotographic photosensitive member due to good processing property, low cost and light weight.

Technology concerning quality of material for the substrate of electrophotographic photosensitive members is described in U.S. Pat. No. 4,702,981 and Japanese Patent Application Laid-Open No.60-262936. U.S. Pat. No. 4,702,981 discloses a technology to a obtain good image quality amorphous silicon electrophotographic photosensitive member by forming the support of aluminum alloy containing less than 2,000 ppm of Fe. Furthermore, U.S. Pat. No. 4,702,981 also discloses the procedures in which a cylindrical substrate is cut by a lathe and mirror finished and then amorphous silicon is formed by glow discharge. Japanese Patent Application Laid-Open No. 60-262936 discloses an extruded aluminum alloy that is superior in vapor deposition of amorphous silicon, which contains aluminum as major component, 3.0–6.0 wt % of Mg and small amounts of impurities such as less than 0.3 wt % of Mn, 0.01 wt % of Cr, 0.15 wt % of Fe and 0.12 wt % of Si. Cleaning of the substrate, however, is not described in the above-described patent literature.

Technology concerning a method for processing the substrate of electrophotographic photosensitive member is described in Japanese Patent Application Laid-Open No.61-171798, which discloses a technology to obtain an electrophotographic photosensitive member such as high quality amorphous silicon by cutting the substrate with a cutting oil of specific composition. It is also disclosed there that the substrate is cleaned with triethane (trichloroethane: $C_2H_3Cl_3$) after cutting.

Technologies concerning surface treatment for substrates of electrophotographic photosensitive member have been proposed in Japanese Patent Application Laid-Open Nos.58-014841, 61-273551, 63-264764 and 1-130159.

Japanese Patent Application Laid-Open No.58-014841 discloses a technology for obtaining uniform oxide film by removing a natural oxide film on a surface of an aluminum support and immersing it into water at a temperature of 60° C. or higher.

Japanese Patent Application Laid-Open No.61-273551 discloses a technology of cleaning as pretreatment of substrate such as alkali cleaning, trichloroethylene cleaning and UV irradiation cleaning by mercury lamp when electrophotographic photosensitive member is produced by vapor depositing Se or the like on an aluminum substrate. It is also disclosed there that liquid degreaser cleaning, vapor degreaser cleaning and pure water cleaning should be done to remove oil and fat attached on surface of cylindrical aluminum substrate as pretreatment for UV irradiation cleaning.

Japanese Patent Application Laid-Open No.63-264764 discloses a technology of making substrate surface roughened by water jet.

Japanese Patent Application Laid-Open No.1-130159 discloses a technology of cleaning a support of a electrophotographic photosensitive member by water jet. It cites Se, organic photoconductive member and amorphous silicon as examples of photosensitive member. It does not discuss at all, however, the possible problems between film formed by plasma CVD method and cleaning by water jet.

On the other hand, there is a known technology, as disclosed in Japanese Patent Application Laid-Open No.60-876, of injecting carbonic acid gas into super pure water to prevent discharge breakdown due to static electricity on wafer surface. However, this technology is a countermeasure for static electricity generating on highly resistive substrate like wafer and nothing is discussed there on the measures for conductive substrates like aluminum.

Various kinds of materials including inorganic materials like selenium, cadmium sulfide, zinc oxide, and amorphous silicon and organic materials like phthalocyanine have been proposed as composition materials for photosensitive members including photoconductive film used for electrophotographic photosensitive members. Among them, non-monocrystalline deposited films containing silicon atom as a major component, such as amorphous silicon, and amorphous silicon that contains hydrogen and/or halogen (such as fluorine and chlorine) for compensation of dangling bonds, have been proposed as photosensitive members of high performance, high durability and free of contamination. Some of them have been used in practice. One example is U.S. Pat. No. 4,265,991 disclosing technology for an electrophotographic photosensitive member whose photoconductive layer is formed mainly of amorphous silicon.

As methods for forming these non-monocrystalline deposited films that contain silicon atom as major component, many conventional methods are known such as a sputtering method, a thermal starting gas decomposing method (thermal CVD method), an optical starting gas decomposing method (optical CVD method), and a plasma starting gas decomposing method (plasma CVD method).

Plasma CVD method, which is a method for decomposing the starting gas by direct current, high frequency wave (including RF wave and VHF wave) or microwave glow discharge to form thin deposited film on the substrate is most suitable for formation of amorphous silicon deposited film for electrophotograph and has been more widely used. In particular, microwave plasma CVD method, which is a plasma CVD method using microwave glow discharge decomposition as method of forming deposited film, has recently been noted from the industrial point of view.

Microwave plasma CVD method has advantage of high decomposition rate and high efficiency in use of the starting gas over other methods. One example of micro wave plasma CVD method making best use of such advantage is described in U.S. Pat. No. 4,504,518, which intends to obtain high quality deposited film at a high deposition rate by microwave plasma CVD method at a low pressure of not higher than 0.1 Torr.

Technology for further improving the efficiency of use of the starting gas by microwave plasma CVD method is disclosed in Japanese Patent Application Laid-Open No.60-186849. Briefly, this technology is to locate the substrates so as to surround the inlet means of microwave energy and form an internal chamber (discharge space) so that the efficiency of use of the starting gas may increase significantly.

Japanese Patent Application Laid-Open No.61-283116 discloses improved microwave technology for production of semiconductor component. Namely, the technology is to improve the characteristics of deposited film by placing electrode (bias electrode) in the discharge space for control of plasma potential and applying the desired voltage (bias voltage) to the bias electrode for controlling ion impact on the deposited film.

In the case aluminum alloy cylinder is used as the substrate, a typical production method of electrophotographic photosensitive member according to these conventional technologies is executed as follows.

A diamond cutting tool (trade name: MIRACLE BITE manufactured by Tokyo Diamond K.K) is set on lathe with air damper for precision cutting (manufactured by PNEUMO PRECISION INC.) in such a manner that the tool is kept to have a relief angle of 5° against the center line of the cylinder. Then the substrate is vacuum-chucked to the rotary flange of the lathe and mirror-finished to obtain 108 mm outside diameter under condition of 1,000 m/min. peripheral speed and 0.01 mm/R delivery speed while jetting kerosene through attached nozzle and at the same time sucking chip through attached vacuum nozzles.

Then, this substrate cut is cleaned with trichloroethane to remove cutting oil and chip remaining on surface.

Next amorphous silicon based deposited film is formed on these mirror finished and cleaned substrates by an apparatus shown in FIG. 1, for forming deposited film of photoconductive component based on glow discharge decomposition method.

FIG. 1 is a schematic transverse sectional view of one example of typical plasma-activated CVD apparatus. In this figure, reference numeral 601 denotes the whole reaction vessel, reference numeral 602 denotes a cathode concurrently functioning as the side wall of reaction vessel, reference numeral 603 denotes a gate which becomes the upper wall of the reaction vessel and reference numeral 604 denotes the bottom wall of the reaction vessel. The cathode 602 described above is insulated respectively with upper wall 603 and bottom wall 604 by insulator 605.

Reference numeral 606 denotes a substrate placed in the reaction vessel installed in a metal substrate holder 607, and the substrate 606 is connected to ground to become anode. Inside the substrate 606, a heater 608 for substrate is installed to heat the substrate to a predetermined temperature before the film formation, to maintain the substrate at a predetermined temperature during the film formation and to give annealing treatment to substrate after the film formation. Reference numeral 609 denotes an inlet pipe for starting material gases for formation of deposited film, and the starting material gases inlet pipe 609 has many gas releasing holes 610 for releasing starting material gas into the reaction space. The other end of the starting material gas inlet pipe 609 is connected to a starting material gas supply system 612 for formation of deposited film through a valve 611. Reference numeral 613 denotes an exhaust pipe to exhaust the inside of the reaction vessel, and the exhaust pipe 613 is connected to an exhausting device 615 such as a vacuum pump through an exhaust valve 614. Reference numeral 616 denotes a means for applying voltage to an cathode 602.

Procedure for operating such deposited film formation apparatus by plasma CVD method is as follows. That is, gases in the reaction vessel is exhausted by vacuum through the exhaust pipe 613, and simultaneously the substrate 606 is heated to a given level of temperature and is maintained at a predetermined temperature by the heater 608. Then, in the case of forming a-SiH deposited film formation, the starting material gas such as silane, is introduced into the reaction vessel through the starting material gas inlet pipe 609. Thus starting material gas is fed to the reaction vessel through the starting material gas releasing holes 610 of the starting material gas inlet pipe 609. At the same time, while doing above operation, plasma discharge is generated by applying, for example, high frequency between the cathode 602 and substrate (anode) 606 from voltage applying means 616. Thus starting material gas within the reaction vessel is excited to form radical particles of Si*, SiH*, etc. ([*] denotes excited state), electrons, ion particles, etc. Chemical interaction between these particles or between these particles and the substrate surface forms deposited film on the subs ate surface.

In the case of forming the electrophotographic photosensitive member comprising a-Si, for example, the substrate holder is inserted into the inside of cylindrical substrate because it is necessary to transport the cylindrical substrate into the reaction vessel and hold it there. This practice of inserting the substrate holder into the inside of the cylindrical substrate is generally done also because it is needed to have auxiliary substrates over and under the substrate for the purpose of making the characteristics uniform as disclosed in, for example, Japanese Patent Application Laid-Open No.60-86276.

However, these conventional methods of manufacturing electrophotographic photosensitive member leave several problems unsolved yet, in order that they may satisfy the need for more uniform film quality and much higher optical and electrical properties and also for steady, stable and highly efficient (high yield) production of deposited film making better image quality in image formation by electrophotographic process.

In other words, higher image quality, higher speed and higher durability are required for electrophotographic apparatus at present. Accordingly, further improvement for longer durability under every probable environment as well as optical properties, electric properties and uniformity is requested for electrophotographic photosensitive members while maintaining higher chargeability and higher sensitivity. In particular, much further improvement of the image properties for electrophotographic photosensitive members is now requested since optical exposure system, development apparatus, and transfer apparatus inside electrophotographic apparatus have been improved for better image properties.

Under such circumstances, locational irregularity of characteristics in an electrophotographic photosensitive member could become a big problem in a high speed continuous image forming system such as a high speed copying system, facsimile system, and printer system using a digital system of coherent light source, in particular, like laser, although it has not necessarily been a problem, or could be neglected in some cases for copying system with conventionally required extent of speed and resolution. In particular, for color copying machines that have become recently popularized, it could be a serious problem because difference in the reproduced color and uneven color are clearly and visually identified.

Furthermore, recent improvement in the resolution of image has now required the reduction of image defects in white and black dots, so-called "spot"; now reduction in much smaller size spot in particular is required which has not been a problem conventionally. Most causes for such spot are abnormal growth of the film called spherical projection; decrease of its number is extremely important.

Conventional application of copying machine has been mainly for so-called "line copy" in which the manuscript comprises letters only. As the image quality of copying machine has been improved in recent years, documents to be copied tend to include halftone such as photos; and these problems such as spot and unevenness or nonuniformity resulting from locational irregularity of characteristics have become serious and their solutions become necessary.

It is required, therefore, that improvement in layer structure, chemical composition of each layer and production method should be made from overall point of view so that problems described above may be solved while the characteristics of electrophotographic photosensitive member itself should be improved.

SUMMARY OF THE INVENTION

An object of the present invention is to provide a method of manufacturing an electrophotographic photosensitive member inexpensively, stably, and at a high yield where a high speed forming is realized with easy handling and to provide a jig for this method, by overcoming abovementioned various problems associated with conventional manufacturing methods for electrophotographic photosensitive members.

Another object of the present invention is to provide a method of manufacturing electrophotographic photosensitive members which can result uniform and high quality image and to provide a jig for this method, by overcoming generation of image defect problem which is especially remarkable in plasma CVD method.

A further another object of the present invention is to provide a method for manufacturing an electrophotographic photosensitive member in which an aluminum substrate is fitted on a substrate holder and a functional film comprising a non-monocrystalline material containing silicon atoms as the matrix is formed by low pressure chemical vapor deposition on the surface of the substrate, which comprises before the step of forming the functional film the step of cleaning the surface of the substrate with water in which carbon dioxide is dissolved, wherein the substrate holder comprises a metal as the matrix and has formed ceramics at least on the inner surface.

A further another object of the present invention is to provide a jig used in a method for preparing a functional film by low pressure chemical vapor deposition on an aluminum substrate fitted on the jig comprising a metal as the matrix and having ceramics formed at least on the surface opposite to the surface on which the aluminum substrate is fitted.

BRIEF DESCRIPTION OF THE DRAWINGS

FIG. 4 is a schematic drawing explaining an example of an apparatus for forming an electrophotographic photosensitive member according to the present invention wherein an electrophotographic photosensitive member is manufactured by an RF glow discharge method.

FIGS. 5A and 5B are schematic drawings explaining an example of an apparatus for forming an electrophotographic photosensitive member according to the present invention wherein an electrophotographic photosensitive member is manufactured by a $\mu$W glow discharge method, wherein FIG. 5A is a side cross sectional view of the apparatus and FIG. 5B is the 5B—5B transverse sectional view of FIG. 5A.

DETAILED DESCRIPTION OF THE PREFERRED EMBODIMENTS

Figure 1:
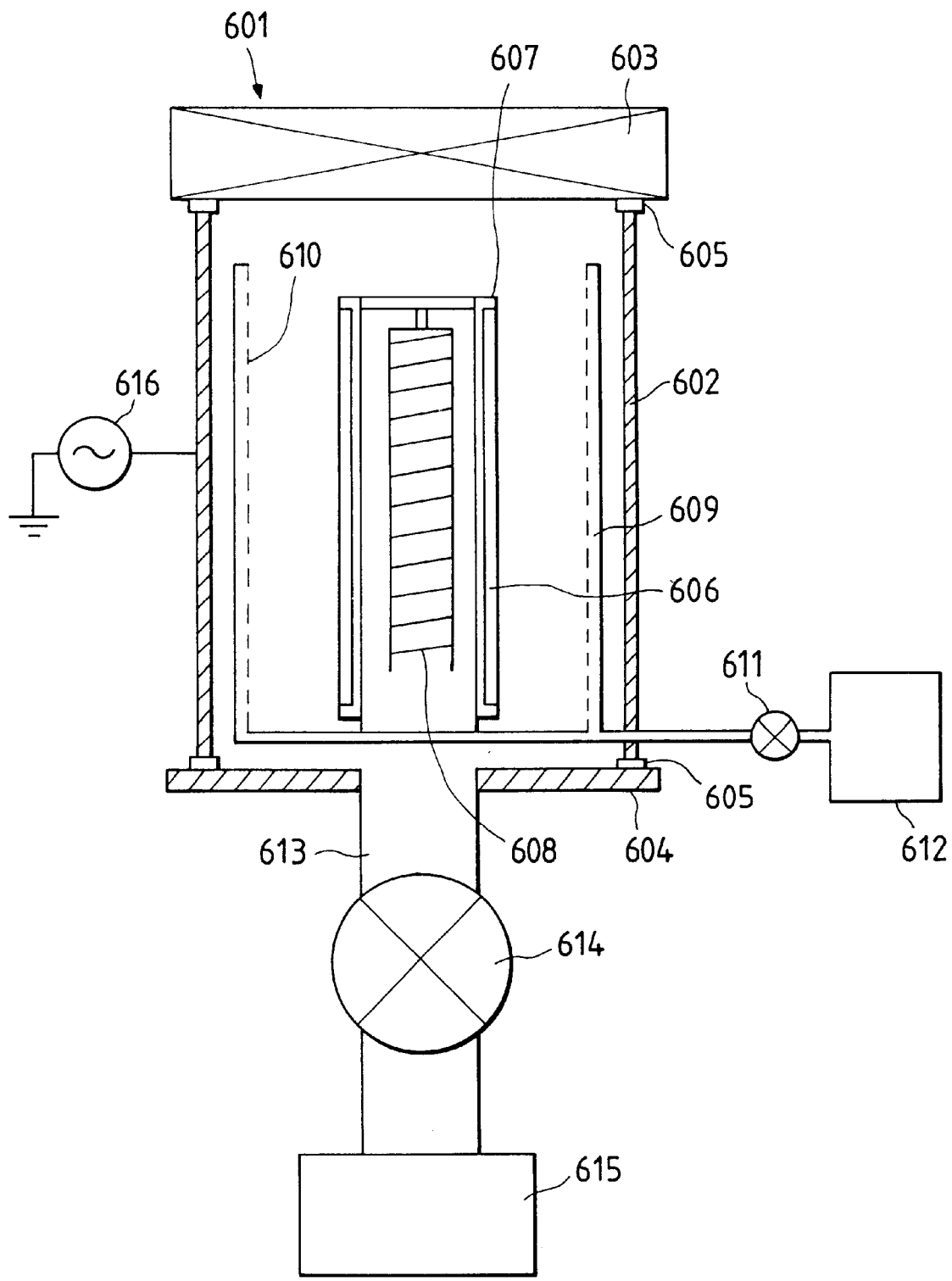
FIG. 1 shows an example of an apparatus for manufacturing an electrophotographic photosensitive member.

In the examination by the inventors, causes of image defects which occur when an aluminum substrate is used can be primarily classified as shown below:

(A) Dust or the like adhering to the substrate becomes a nucleus.

(B) A surface defect of the substrate becomes a nucleus.

Adhesion of dust or the like in (A) can be prevented to some extent by keeping the place for cutting and cleaning where the substrates are handled clean, strictly cleaning an interior of a film forming oven and cleaning the surface of substrate shortly before formation of the deposited film. The purpose of such cleaning has been achieved by cleaning the substrates with a chlorine-based solvent such as trichloroethane. However, since the use of chlorine-based solvent has been limited for the reason of destruction of the ozone layer of the earth in recent years, it is necessary to carefully examine this problem. In addition, the image defects should be further decreased as mentioned above. On the other hand, it has been extremely difficult to reduce the image defect in (B).

The inventors investigated and found that areas of local high hardness are found in aluminum, and that a surface defect on an aluminum substrate is generated by hollowing the high hardness area with the cutting edge of a processing machine when finishing a surface with a cutting operation such as a pre-finishing process, prior to deposited film formation. This is the cause of (B), obviously.

Furthermore, usually impurities included in aluminum are preferred to be small in quantity to prevent these phenomenon. However, high purity aluminum causes the above-mentioned defect generation by the oxide growth which is generated inevitably when melting during processing aluminum raw material. To prevent this problem, it is proved to be effective to contain silicon atom in the substrate.

When cleaning using solvent including chlorine such as trichlorethane after machining operation of substrate surface, generation of image defect due to substrate surface characteristics can be prevented enough by the above mentioned action.

However, recently the inventors investigated on cleaning because solvent including chlorine can not be used easily because of environmental problem. As a result, it has been found that aluminum generates corrosion with water. Especially aluminum including silicon atom generates significant corrosion by water centering locally enriched area of silicon atom when soaking in water for cleaning operation.

This phenomenon is significant as water temperature gets higher, and it is more significant when magnesium is included with silicon atom in aluminum to improve cutting characteristic. Although various corrosion inhibitors are proposed to prevent corrosion of aluminum, the effect is not enough when aluminum substrate including silicon is used for the substrate for electrograhic photosensitive member because even a small defect generated at large substrate in area causes a problem. Furthermore, bad effect on electrophotographic characteristics is generated after deposited film formation as very small quantity of these corrosion inhibitor is remained on the surface of substrate after cleaning. In other words, when some component other than the one rapidly evaporating at the same speed as water do, remains on the surface of aluminum substrate, adverse effect such as abnormal spots on image is generated when preparing electrograhic photosensitive member. Therefore the use of usual corrosion inhibitor will be restricted.

The inventors studied seriously whether the generation of the above mentioned defects can be restrained or not, by treating water used during cleaning operation in order to remove adhered dust prior to deposited film formation. As a result, the present invention was completed.

Although the mechanism of the present invention has not been cleared yet, the inventors consider at this time, as follows.

Area containing many silicon atom that is partly exposed on the aluminum surface will form a local cell with surrounding normal aluminum area, and accelerates the corrosion.

On the other hand, carbon dioxide dissolved in water changes into carbonate ion, and is pulled toward these local cell, and covers the surroundings of the local cell, preventing corrosion effectively by preventing access of oxygen in water. In addition, carbonate ion prevents generation of irregular growth from this area during deposited film formation by causing some modification on the surface of the area including many silicon atom.

Furthermore, the present inventors have found, after serious study on decreasing dust, that while dust from the substrate holder is not so serious in normal environment, dust generated from the step of heating the substrate for forming electrograhic photosensitive member creates a problem.

That is, a metal such as aluminum and stainless steel has been used generally as the substrate holder for the purpose of making electrical contact with the substrate and/or grounding the substrate holder. These metallic substrate holders cause thermal expansion when the substrate is heated. In this occasion, dust adhering to the inner surface of the substrate holder is removed by the change of surface shape, and remains or deposits in the vacuum vessel. Accordingly, inside of vacuum reaction vessel is contaminated by dust, and dust adheres to the surface of the substrate.

According to the present invention, ceramics are formed on the inner surface of the substrate holder. Since the coefficient of thermal expansion of ceramics is lower than metals, change of surface shape by heating is smaller. Therefore, dust generation from the substrate holder is reduced substantially.

Furthermore, since hardness of ceramics is high, dust is difficult to adhere on the surface of ceramics, which makes the dust generation lowered as well. That is, since a portion of the substrate holder surface is exposed in vapor phase growth space inevitably, deposited film is formed in such area as is same as the substrate surface. These deposited film will fall away at last and causes dust, therefore it is necessary to replace the surface of the substrate holder every time. In the replacement, a situation occurs where a piece of film generating in the replacing procedure "sticks" the inner surface in the case of conventional metal inner surface such as aluminum. When blasting treatment with liquid honing is made in particular as the replacement procedure, glass piece or metal piece as well as the film piece adheres to the surface. The "stuck" pieces are difficult to fall away under normal circumstances, however, they will be removed when the surface is thermally expanded by heating as mentioned above.

When the inner surface of the substrate holder is of ceramics as is the present invention, pieces of film and others generated during the replacement procedure "stick" very seldom due to the high surface hardness. Thus, dust formation from the substrate holder is decreased substantially since the absolute quantity of dust adhered to the surface is decreased.

Furthermore, unexpected improvement in electrophotographic characteristics has been realized in the present invention.

This is understood to be because of the fact that carbonate ion improves the surface activity of aluminum by dissolving the whole surface uniformly and slightly whereby it is made possible to form the surface on which electric charges are exchanged smoothly when deposited film is formed; this results in improvement of the characteristics such as improvement of chargeability and reduction of residual electrical potential.

Furthermore, according to the present invention, a precleaning step is provided, for enhancement of above described effects, between the cutting step and the cleaning step using water containing dissolved carbon dioxide for the purpose of completely removing residual oil and fat and halogen derivatives that prevent the effects of the present invention. In particular, the highest effects is realized by the precleaning step of ultrasonic cleaning in water or water containing a surfactant.

Still furthermore, the forming method according to the present invention improves the durability drastically while maintaining excellent electric and image characteristics.

That is, since spherical projections are reduced as mentioned above, even continuous large volume image formation will little cause damages to cleaning blade or separating claw; whereby cleaning characteristic and separating characteristic of transfer papers are improved. In this way, durability of image forming apparatus can be improved dramatically. Furthermore, since the number of spherical projection decreases, defects of spherical projection incurred by rubbing of transfer paper or cleaning blade with light-receiving member is reduced substantially; and increase of image defects due to long period use can be mitigated.

Further, through serious study on reducing image density unevenness, the present inventors have found correlation between the image density unevenness and the discoloration of the inner surface of substrate, shaped like a drum, after formation of the deposited film. That is, the difference in image density develops in compliance with the not discolored portion and discolored portion and the extent of discoloration. The extent of discoloration of the inner surface of substrate is uneven and differs in the place and extent depending on when the deposited film is formed (lot).

Although the mechanism through which the discoloration of the inner surface of the substrate develops the image density unevenness has not been clear, thought of the inventors is as follows.

For example, when amorphous silicon deposited film is formed on a substrate by plasma CVD method, the reaction may be studied by dividing into three processes: decomposition process of starting material gas in vapor phase, transportation process of the active species from the discharge space to the substrate surface, and the surface reaction process on the substrate surface. Among them, the surface reaction process takes a very important part in deciding structure of the completed deposited film. Such surface reaction is affected strongly by the temperature, material, shape, adsorbed substances and other factors of the substrate surface. The growing process on the substrate is explained hereunder in more details for the case of amorphous silicon containing hydrogen as an example.

Decomposed species that is decomposed in the plasma and transported form a network of amorphous silicon film by adhering to the substrate; chemical reactions (relaxation process) occur on the growing silicon surface of amorphous silicon that has not completed three dimensional networks toward the stable direction in terms of energy where structural defects are small by way of releasing hydrogen atom, bonding of hydrogen atom and silicon atom to dangling bond, rearrangement of atoms having higher bond energy, and others. As the result, phenomena such as decreasing of dangling bonds, lowering of gap level density, and decreasing of Si—$H_2$ bonds (Si—H bond becoming predominant) are observed. Since these reactions are governed by the heat energy of the substrate, locational unevenness in the substrate temperature influences the characteristic of the deposited film directly; thereby, locational unevenness in running of the electric charges (photo carriers), the composition and structure of the interface between the deposited film and the substrate may change, and locational unevenness in charging tendency from the substrate may develop in the step of electrophotography. Such phenomena cause difference of the surface electric potential large enough to change the image density, generating image density unevenness in the produced image.

While heating method of the substrate may be direct heating of the vapor phase epitaxial surface with infrared rays or others, installation of heating means in the vapor phase epitaxial side is practically difficult; and the heating means is usually installed at the inner part of the substrate holder. Thus, the heat received at the inner surface of the substrate holder is indirectly transferred to the substrate for heating the substrate to a predetermined temperature. It is desirable to make the substrate material parts and the heating means not contacted for continuous manufacture in particular since the substrate material parts that comprise the substrate and substrate holder are, after the transportation step, to be connected to the heating means that is a fixed part and since the substrate material parts are to be rotated for realizing uniform characteristics. Under such conditions, main heat transfer is made by heat radiation from the heating means to the inner surface of the substrate holder; finally, the heat is transferred from the substrate holder to the substrate by radiation. If color unevenness is developed in the inner surface of the substrate, uneven temperature occurs corresponding to the color unevenness as the heat radiation varies depending on the color; thereby image density unevenness occurs.

According to the present invention, image density unevenness has been significantly improved by way of inhibition of discoloration in the inner surface of the substrate and elimination of uneven discoloration. While mechanism of such performance has not been elucidated, the inventors understand at present as follows.

Discoloration of the inner surface is mitigated by making the substrate temperature lower and becomes conspicuous when the temperature of the substrate is elevated; therefore, the discoloration is understood to be induced by temperature. Thus, the material present on the inner surface changes at an elevated temperature, which phenomenon results discoloration of the inner surface. Uneven discoloration in the surface may be either due to unevenness of the material present in the inner surface or due to uneven temperature elevation.

In the present invention, carbon dioxide is dissolved in water as described above and the water contains carbonate ions. The carbonate ion causes some change in quality of the material mentioned above that is present on the inner surface. Such change brought by carbonate ion does not discolor the inner surface of the substrate at all since the mechanism of quality change differs from what is brought by temperature elevation. The material that is changed in quality by carbonate ion in this way discolors at an elevated temperature to a significantly decreased degree. Furthermore, use of a substrate holder (a jig) comprising a metal as the matrix and ceramics at least in the inner surface, makes it possible to elevate the temperature of the inner surface of the substrate uniformly; thereby, uneven discoloration in the surface and unevenness among lots are eliminated. As discussed before, temperature of the substrate rises by heat radiation from the substrate holder. Thus, uniform temperature elevation in the substrate inner surface requires uniform temperature elevation of the substrate holder. In another words, uneven local conditions in the inner surface of the substrate holder change the temperature accordingly.

The uneven local conditions in the inner surface may be of color or roughness of the surface. While why such unevenness in the surface conditions is caused is not clear, uneven surface color might be brought by the quality change of the surface due to the temperature. The surface roughness might be caused by variation associated with renewal of the substrate holder. That is, a part of the substrate holder surface is inevitably exposed to the vapor phase growth space; the same deposited film as on the substrate surface is formed on such part. Since such deposited film is peeled off at last and turned to dust, the surface of the substrate holder has to be renewed every time. Such renewal may influence the inner surface to some extent varying every time.

According to the present invention, the inner surface of the substrate holder is of ceramics having high heat resistance which inhibits change of the surface quality and also high hardness which decreases the variation of the surface roughness; thereby, uniform heat radiation is received on the inner side of the substrate holder.

Since the substrate holder is mainly composed of a metal, the uniformity is further improved. That is, the heat received by the inner surface ceramic is transferred through the internal of the substrate holder by thermal conduction to the surface of the substrate holder; since the internal of the substrate holder is a metal of good thermal conductivity, the uniformity is further improved.

In this way, using the substrate cleaned with water in which carbon dioxide is dissolved and simultaneously using the substrate holder comprising a metal as the matrix and at least ceramic inner surface make, by their synergistic effect, it possible to improve uniformity of the deposited film, which significantly improves image density unevenness at halftone.

Furthermore, according to the present invention, number of spherical projection occurrence is decreased; thereby, image defects of white dots and black dots, so-called "spot", are substantially decreased.

Now, the present invention is explained in more details.

Figure 2:
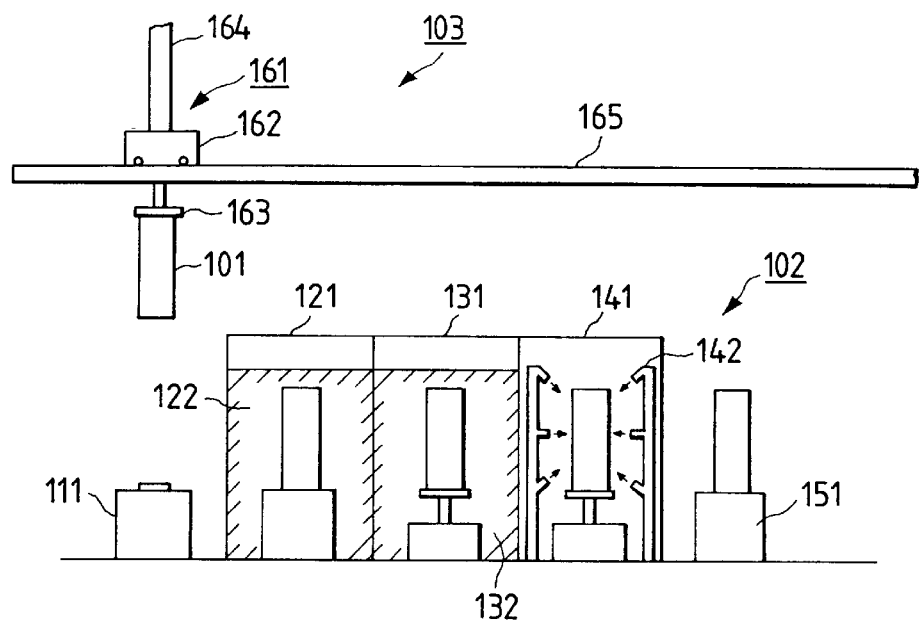
FIG. 2 is a schematic vertical sectional view of a pretreatment apparatus to be used to execute a method of manufacturing electrophotographic photosensitive members according to the present invention.
Figure 3:
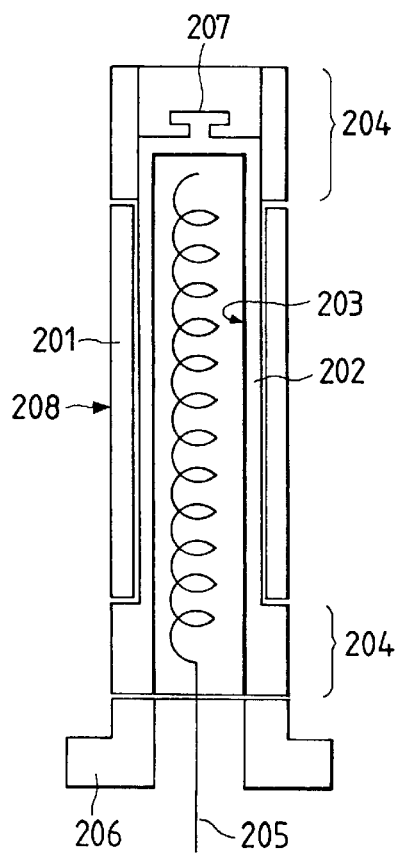
FIG. 3 is a schematic drawing explaining an embodiment of an assembly suitable for carrying out a method for forming a photosensitive member according to the present invention.
Figure 5A:
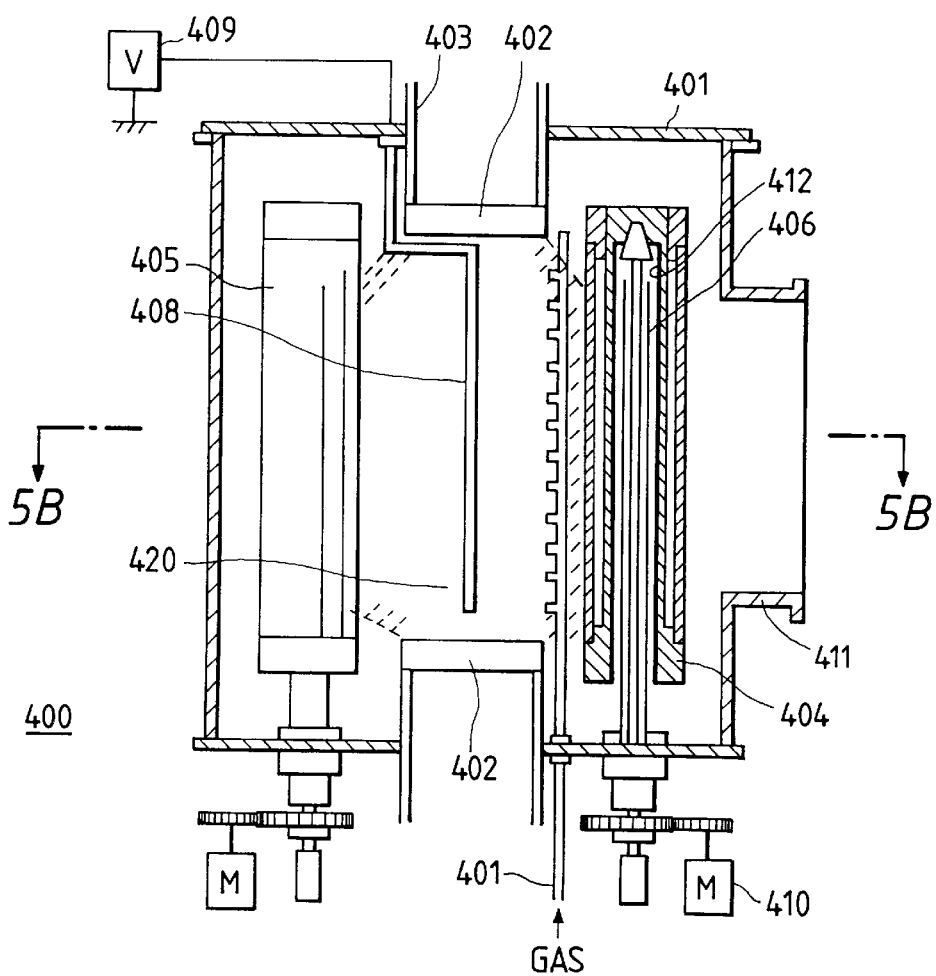
Figure 5B:
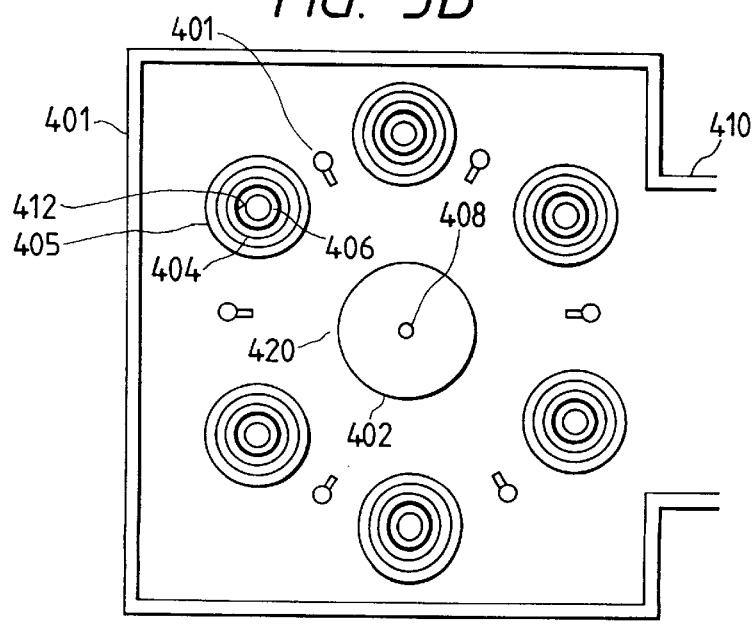
Figure 6:
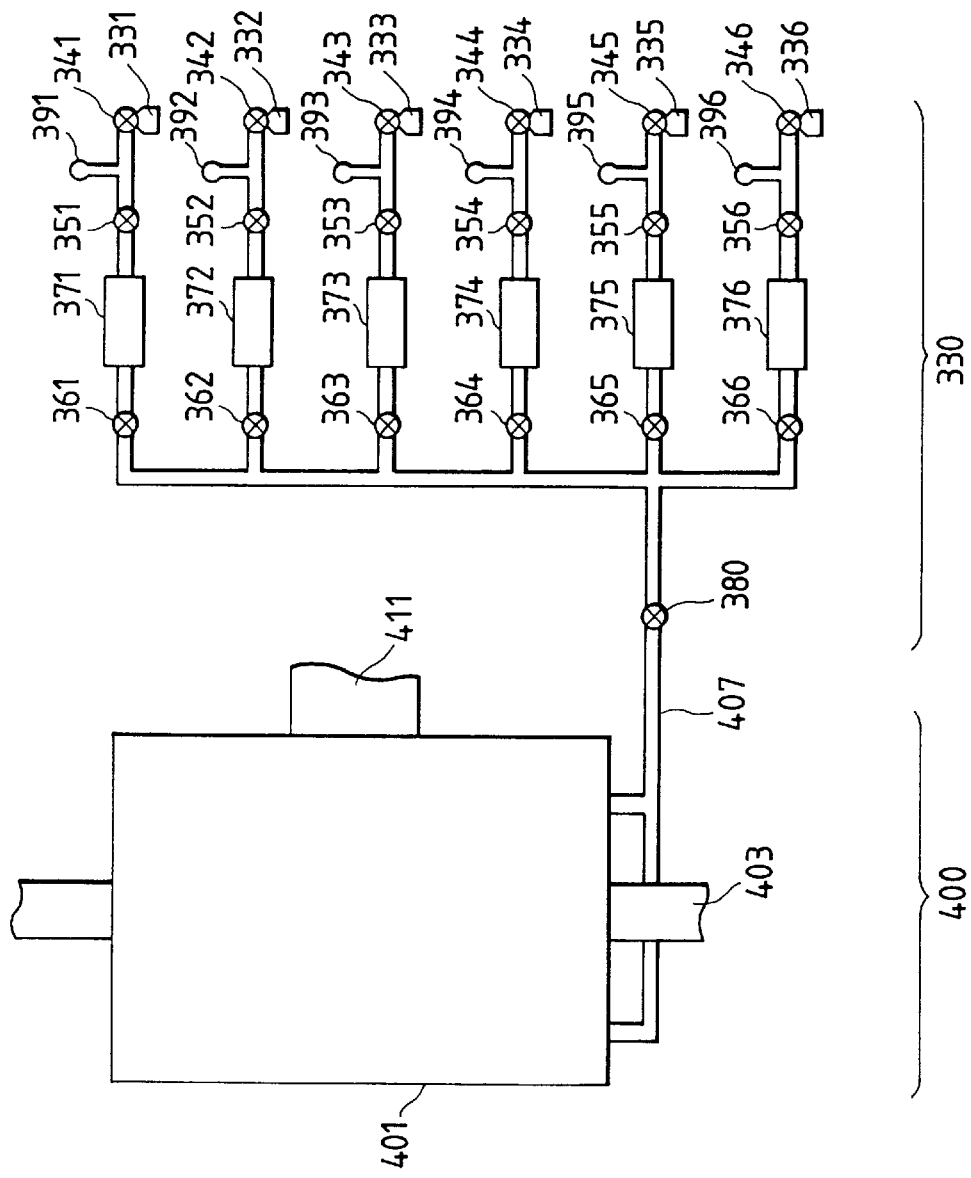
FIG. 6 is a schematic drawing explaining an example of an apparatus for forming an electrophotographic photosensitive member according to the present invention wherein the RF glow discharge method of FIG. 3 in the apparatus for forming an electrophotographic photosensitive member is replaced by the deposition apparatus of FIGS. 5A and 5B.

An example of practical procedures for forming an electrophotographic photosensitive member according to the method for manufacturing an electrophotographic photosensitive member of the present invention using an aluminum-alloy cylinder as the substrate is explained hereunder by referring to an example of substrate pretreatment apparatus according to the present invention shown in FIG. 2 and an example of deposited film forming apparatus shown in FIGS. 4 through 6 with a schematic drawing showing a typical example of the substrate material parts shown in FIG. 3 for the purpose of explaining the manufacturing method according to the present invention.

A diamond cutting tool (trade name: MIRACLE BITE manufactured by Tokyo Diamond K.K.) is set on a lathe provided with an air damper for precision cutting (manufactured by PNEUMO PRECISION INC.) so as to obtain a relief angle of 5° in reference to the central angle of the cylinder. Then the substrate is vacuum-chucked to the rotary flange of this lathe and mirror-finished at a peripheral speed of 1000 m/min. and a feed rate of 0.01 mm/R so as to obtain an outside diameter of 108 mm while spraying white kerosene from attached nozzles and sucking used kerosene which contains chip through attached vacuum nozzles.

Then each cut substrate is subjected to a treatment of the substrate surface by a substrate pretreatment apparatus. The substrate pretreatment apparatus shown in FIG. 2 comprises a treatment zone 102 and a substrate transport mechanism 103. The treatment zone 102 has a substrate feed stand 111, a substrate precleaning bath 121, a water treatment bath 131 using water containing dissolved carbon dioxide, a drying bath 141 and a substrate carry-out stand 151. Both the precleaning bath 121 and the water treatment bath 131 using water in which carbon dioxide is dissolved are respectively provided with a thermostat (not shown) for maintaining the liquid at a fixed temperature. Although the thermostat is not always required, it is preferably provided for stable treatment. The substrate transport mechanism 103 has transport rails 165 and transport arm 161 and the transport arm 161 has a moving mechanism 162 which moves along the rails 165, a chucking mechanism 163 for holding the substrate 101 and an air cylinder 164 for vertically moving the chucking mechanism 163.

After cutting, the substrate 101 set on the substrate feed stand 111 is transported to the substrate precleaning bath 121 by the substrate transport mechanism 103. Cutting oil and chip adhering to the substrate surface are cleaned off by ultrasonic treatment in aqueous solution 122 containing surface active agent in the substrate precleaning bath 121.

The substrate 101 is transported to the cleaning bath 131 using water in which carbon dioxide is dissolved by the substrate transport mechanism 103 and is further cleaned with water which is kept at 25° C. and contains dissolved carbon dioxide. Conductivity of water containing dissolved carbon dioxide is measured with an industrial conductivity meter (trade name: α900 R/C manufactured by Horiba Seisakusho Co., Ltd.) and controlled to be maintained at approximately 10 μS/cm by dissolving carbon dioxide as required. The symbol "S" denotes "siemens"; the SI unit of electrical conductance in which $1S=1\ \Omega^{-1}$, also known as "mho." The substrate 101 which has been cleaned with water containing dissolved carbon dioxide is transported to the drying bath 141 by the substrate transport mechanism 103 and dried with a blow of hot high pressure air from nozzles 142.

The substrate 101 dried in the drying steps is transported to the substrate carry-out stand 151 by the transport mechanism 103.

The substrate of which cutting and pretreatment are completed is fitted on the substrate holder as shown in FIG. 3, and formation of deposited film mainly comprising amorphous silicon is made using deposition film forming apparatus of plasma CVD method as shown in FIGS. 4 to 6. In FIG. 3, the reference numeral 202 indicates the substrate holder. The substrate holder 202 comprises inner surface 203 formed with ceramics marked with a bold line in the figure and other metallic base material.

The inner surface 203 of the substrate holder 202 receive radiant heat from a heating means 203 directly. The heat received by the inner face 203 is transferred through the internal of the substrate holder 202 by thermal conduction to the inner surface of the substrate 201 fitted on the surface of the substrate holder 202, and finally to the surface 208 of the substrate 201.

FIG. 3 shows a typical configuration; auxiliary substrate 204 shown in the figure may be eliminated if required. A stand 206 may be replaced with an heater that also serves as the support.

Now, apparatus and methods for forming deposited film by high-frequency plasma CVD method and microwave plasma CVD method is illustrated in more details.

FIG. 4 is a schematic drawing explaining an example of an apparatus for forming an electrophotographic photosensitive member by using high-frequency plasma CVD (hereinafter referred to as "RF-PCVD").

Structure of the apparatus for manufacturing deposited film by RF-PCVD method shown in FIG. 4 comprises a deposition device 300, a feed device 330 for starting material gas, and an exhausting device (not shown) for making the internal of a reaction vessel 301 vacuum in principle. In the reaction vessel 301 that is located inside the deposition device 300, a conductive cylindrical substrate 302 fitted on a substrate holder 303 that has a metallic base material and a ceramic formed on its inner surface 311 is allowed to be installed; and a heater 304 for heating the substrate, a gas feed pipe 305 for the starting material gas are respectively provided. Further, a high frequency matching box 306 is connected.

The feed device 330 for starting material gases comprises gas cylinders 331 to 336 for $SiH_4$, $H_2$, $CH_4$, NO, $B_2H_6$, $GeH_4$, valves 341 to 346, 351 to 356, 361 to 366, and mass flow controllers 371 to 376. Respective starting material gas cylinders are connected to the gas feed pipe 305 in the reaction vessel vessel 301 through a valve 380.

Formation of deposited film by this apparatus can be performed, for example, as described below.

First, the cylindrical substrate 302 fitted on the substrate holder 303 comprising a metal as the matrix and ceramics formed on its inner surface is installed and the internal of the reaction vessel 301 is exhausted by a exhausting device such as a vacuum pump (not shown).

Next, the heater 304 for heating the substrate is turned on. Then, the inner surface ceramics 311 (shown with bold line) of the substrate holder 303 receives the radiant heat from the substrate heater 304 directly. The heat received on the inner face is transferred by thermal conduction through the internal of the base material metal and transferred to the inner face of the cylindrical substrate 302 making the temperature of cylinderical substrate 302 controlled finally to a predetermined temperature of 100 to 500° C.

Feeding the starting material gases for deposited film forming into the reaction vessel 301 is made according to the following procedures. Check that the valves 341 to 346 of the gas cylinders and the leak valve 308 of the reaction vessel are closed. Confirm that the inlet valves 351 to 356, outlet valves 361 to 366, auxiliary valve 380 are closed. Open the main valve 309 at first to exhaust internal of the reaction vessel 301 and a gas conduit 307.

When the reading of a vacuum gauge 310 becomes $5 \times 10^{-6}$ Torr, close the auxiliary valve 308 and outlet valves 361 to 366.

Thereafter, introduce respective gases as required from the gas cylinders 331 to 336 by opening necessary valves 341 through 361, and adjust each gas pressure (e.g. 2 Kg/cm$^2$) using pressure controllers 391 through 336. Then, introduce respective gases into mass flow controllers 371 through 376 by gradually opening desired inlet valves 351 through 356.

Now, the preparation of the film forming is completed. Then, respective layers, for example, charge blocking layer, photosensitive layer, and surface layer on the cylindrical substrate 302 are formed.

When the temperature of the cylindrical substrate 302 reaches the predetermined one, gradually open necessary outlet valves 361 through 366 and the auxiliary valve 380 to introduce required gases from the gas cylinders 331 through 336 into the reaction vessel 301 though the gas feed pipe 305. Adjust respective gas flows as required by the mass flow controllers 371 through 376. In this adjustment, set the opening of the main valve 309 is so that the pressure inside the reaction vessel 301 becomes the predetermined one that is 1 Torr or less by watching the vacuum gauge 310. Set the RF power source (not shown) to the desired power level when the internal pressure is stabilized and supply RF power into the reaction vessel 301 through the high frequency matching box 306 to generate RF glow discharge. The discharge energy decomposes the starting material gases introduced into reaction vessel, resulting in deposited film with desired silicon contents on the cylindrical substrate 302. When desired deposited film is formed, turn off the RF power, close the outlet valves to stop the gas flow into the reaction vessel to conclude the process. Repetition of similar operation forms desired multi-layered light-receiving layer.

Needless to say, when forming each layer, the outlet valves of gases not desired are to be closed. In order to avoid the gases remaining in the reaction vessel 301 and piping from the outlet valves 361–366 to the reaction vessel 301, the outlet valves 361–366 are to be closed while the auxiliary valve 380 is to be opened followed by an operation as required in which the main valve 309 is fully opened for exhausting the whole system to a high vacuum.

For the purpose of making the formed film uniform, the cylindrical substrate 302 is rotated at a predetermined speed by a driving device (not shown) during the film formation. Of course, various modifications may be applied to above kinds of gases and valve handling depending on the forming conditions of respective layers.

The heating means for the cylindrical substrate 302 may be any heaters provided that vacuum specifications are satisfied; examples of them include electrical resistive heaters such as sheath type heater (coil heater), plate heater and ceramic heater, heat radiation lamp heaters such as halogen lamp and infrared lamp, and heaters by heat exchange using a heat medium such as liquid or gas. Surface material of the heaters may be a metal such as stainless steel, nickel, aluminum, or copper, a ceramic, or a heat resistant high polymer resin. Alternatively, a vessel solely for heating purpose may be installed in addition to the reaction vessel 301, by which the cylindrical substrate 302 is heated; thereafter, the cylindrical substrate 302 is transported into the reaction vessel 301 under vacuum.

Now, a method for manufacturing electrophotographic photosensitive member formed by $\mu$W-PCVD method is explained.

FIGS. 5A and 5B are schematic drawings showing an example of an apparatus for forming an electrophotographic photosensitive member using microwave plasma CVD (hereinafter referred to as $\mu$W-PCVD) and FIG. 6 is a schematic drawing which shows the piping of starting material gases are connected to the apparatus of FIGS. 5A and 5B for forming deposited film.

This apparatus comprises a reaction vessel 401 which has an airtight structure and is able to be put into vacuum conditions, a feed device 330 for starting material gas, and an exhausting device (not shown) for making the internal of the reaction vessel 401 vacuum. In the reaction vessel 401, there are provided with a microwave guide window 402 which is formed with a material (for example, quartz glass, alumina ceramics or the like) admitting the microwave power efficiently and being able to maintain vacuum tightness, a microwave guide 403 which is connected to the microwave power source (not shown) through a stub tuner (not shown) and an isolator (not shown), a cylindrical substrate 405 for forming a deposited film which is fitted on a substrate holder 404 comprising a metal as the matrix and ceramics 412 formed on the inner surface, a heater 406 for heating the substrate, a source gas feeding conduit 407, and an electrode 408 which provides external electric bias for controlling plasma electric potential. Internal of the reaction vessel 401 is communicated to a diffusion pump (not shown) through an exhaust pipe 411.

The feed device 330 for starting material gas comprises gas cylinders 331 to 336 for SiH$_4$, H$_2$, CH$_4$, NO, B$_2$H$_6$. SiF$_4$, valves 341 to 346, 351 to 356, 361 to 366, and mass flow controllers 371 to 376. Respective starting material gas cylinders are connected to the gas feed pipe 407 in the reaction vessel vessel through a valve 380. The space 420 surrounded by the cylindrical substrate 405 forms discharge space. Formation of deposited film by this apparatus according to $\mu$W-PCVD method can be performed, for example, as described below.

First, the cylindrical substrate 405 fitted on the substrate holder 404 comprising a metal as the matrix and ceramics formed on its inner surface is installed and rotated by a driving device 410; and the internal of the reaction vessel 401 is exhausted by a exhausting device such as a vacuum pump (not shown) through the exhaust pipe 411 to adjust the internal pressure of the reaction vessel 401 to $1 \times 10^{-6}$ Torr or less. Subsequently, the heater 406 for heating the substrate is turned on. Then, the inner surface ceramics (shown with bold line) of the substrate holder 404 receives the radiant heat from the substrate heater 406 directly. The heat received on the inner face is transferred by thermal conduction through the internal of the base material metal and transferred to the inner face of the cylindrical substrate 404 making the temperature of the cylindrical substrate 405 controlled finally to a predetermined temperature of 50 to 500° C.

Feeding the starting material gas for forming deposited film into the reaction vessel 401 is made according to the following procedures. Check that the valves 341 to 346 of the gas cylinders and the leak valve (not shown) of the reaction vessel are closed. Confirm that the inlet valves 351 to 356, outlet valves 361 to 366, auxiliary valve 380 are closed. Open the main valve (not shown) at first to exhaust internal of the reaction vessel 401 and a gas conduit 307. When the reading of a vacuum gauge (not shown) becomes $5 \times 10^{-6}$ Torr, close the auxiliary valve 380 and outlet valves 361 to 366.

Thereafter, introduce respective gases as required from the gas cylinders 331 to 336 by opening necessary valves 341 through 346, and adjust each gas pressure (e.g. 2 Kg/cm$^2$) using pressure controllers 391 through 336. Then, introduce respective gases into mass flow controllers 371 through 376 by gradually opening desired inlet valves 351 through 356.

Now, the preparation of the film forming is completed. Then, respective layers, for example, charge blocking layer, photosensitive layer, and surface layer on the cylindrical substrate 405 are formed.

When the temperature of the cylindrical substrate 405 reaches the predetermined one, gradually open necessary outlet valves 361 through 366 and the auxiliary valve 380 to introduce required gases from the gas cylinders 331 through 336 into the discharge space 420 in the reaction vessel 401 though the gas feed pipe 407. Adjust respective gas flows as required by the mass flow controllers 371 through 376.

In this adjustment, set the opening of the main valve (not shown) is so that the pressure inside the discharge space 420 becomes the predetermined one that is 1 Torr or less by watching the vacuum gauge (not shown). After stabilization of the internal pressure, by use of microwave power source (not shown), generate microwave of 500 MHz or higher, preferably 2.45 GHz, set the power of the microwave power source (not shown) to the desired power level, and transmit the µW energy into the discharge space 420 through the waveguide 403 and microwave guide window 402 to generate µW glow discharge. Simultaneously, apply an electric bias (e.g. direct current) from the power source 409 to the electrode 408.

In this way, within the discharge space 420 surrounded by the substrate 405, introduced source gases are excited by the microwave energy, and is dissociated; thereby, desired deposited film results on the cylindrical substrate 405. When doing this, rotate the substrate at a desired speed to gain uniform layer forming by use of a motor 410 for rotating the substrate. When desired deposition film is formed, stop supplying µW power, close the outlet valves to stop the gas flow into the reaction vessel to conclude the process.

Repetition of similar operation forms desired multi-layered light-receiving layer.

Needless to say, when forming each layer, the outlet valves of gases not desired are to be closed. In order to avoid the gases remaining in the reaction vessel 401 and piping from the outlet valves 361–366 to the reaction vessel 401, the outlet valves 361–366 are to be closed while the auxiliary valve 380 is to be opened followed by an operation as required in which the main valve (not shown) is fully opened for exhausting the whole system to a high vacuum. Of course, various modifications may be applied to above kinds of gasses and valve handling depending on the forming conditions for respective layers.

The heating means for the cylindrical substrate 405 may be any heaters provided that vacuum specifications are satisfied; examples of them include electrical resistive heaters such as sheath type heater (coil heater), plate heater and ceramic heater, heat radiation lamp heaters such as halogen lamp and infrared lamp, and heaters by heat exchange using a heat medium such as liquid or gas. Surface material of the heaters may be a metal such as stainless steel, nickel, aluminum, or copper, a ceramic, or a heat resistant high polymer resin. Alternatively, a vessel solely for heating purpose may be installed in addition to the reaction vessel 401, by which the cylindrical substrate 405 is heated; thereafter, the cylindrical substrate 405 is transported into the reaction vessel 401 under vacuum.

In µW-PCVD method, the inner pressure of charge space is preferably $1 \times 10^{-3}$ to $1 \times 10^{-1}$ Torr, more preferably $3 \times 10^{-3}$ to $5 \times 10^{-2}$ Torr, most preferably $5 \times 10^{-3}$ to $3 \times 10^{-2}$ Torr.

It is preferable that an outer pressure of the charge space is lower the inner pressure of the charge space. Under the inner pressure of the charge space being $1 \times 10^{-1}$ Torr or less, more particularly $5 \times 10^{-2}$ Torr or less, when the inner pressure of the charge space is three times or more the outer pressure of the charge space, particularly characteristics of a deposited film is remarkably improved.

A method for introducing microwave to the reaction furnace includes a method using a waveguide and a method for introducing microwave into the reaction furnace includes a method using one or a plurality of dielectric windows. Material for guide window for introducing microwave into the reaction furnace includes materials having less loss of microwave such as alumina ($Al_2O_3$), aluminium, nitride (AlN), boron nitride (BN), silicon nitride (SiN), silicon carbide (SiC), silicon oxide ($SiO_2$), beryllium oxide (BeO), Teflon, polystylene and the like.

An electric field generated between the electrode 408 and the cylindrical substrate 405 is preferably a direct current electric field. Direction of the electric field is preferably from the electrode 408 to the cylindrical substrate 405. An average strength of DC voltage applying to the electrode 408 for generating an electric field is preferably from 15 V to 300 V, more preferably 30 V to 200 V. Waveform of DC voltage is not limited and various forms are available for the present invention. That is, any case is useful provided that voltage direction does not change depending on time, for example, constant voltage which does not change its strength depending on time is, of course, available. Further, pulsating voltage which changes its strength depending on pulse voltage and time for rectifying by a rectifier is also available.

It is effective to apply alternating current voltage. In a frequency of alternating current, any frequency is useful, practically 50 Hz to 60 Hz in low frequency and 13.56 MHz in high frequency is preferable. As a waveform, sign wave, rectangular wave or any other wave is available, practically sign wave is preferable. In every case of voltage effective value should be noted.

Any size and shape of the electrode 408 are available provided that discharge is not disordered, practically cylindrical shape having a diameter of 0.1 cm to 5 cm is preferable. At this time, a length of the electrode 408 may be optionally set provided that electric field is uniformly applied to a substrate.

As a material for the electrode 408, any one of which surface becomes conductive may be used. For example, a metal such as stainless steel, Al, Cr, Mo, Au, In, Nb, Te, V, Ti, Pt, Pd and Fe; alloys thereof; and glass, ceramics and plastics of which surface is subjected to condutive treatment.

In the present invention, it is preferably to use water containing, particularly, a surface active agent in precleaning. Though any kind of quality of water before the surface active agent is dissolved in water is available for water cleaning, a semiconductor grade purified water, particularly a super LSI grade purified water is preferable. Specifically, for the present invention, the lower limit value of electrical resistivity at the water temperature of 25° C. is 1 MΩ·cm or more as a preferable value, 3 MΩ·cm or more as a more preferable value, or 5 mΩ·cm or more as a most suitable value, and the upper limit value of resistivity is 17 MΩ·cm or less as a preferable value, 15 MΩ·cm or less as a more preferable value, or 13 MΩ·cm or less as a most suitable value from the viewpoint of costs and productivity, though any value up to a theoretical value (18.25 MΩ·cm) is available. For the present invention, a quantity of fine grains of 0.2 μm or more in diameter per milliliter is 10000 pieces or less as a preferable value, 1000 pieces or less as a more preferable value and 100 pieces or less as a most suitable value. For the present invention, a total number of live microbes per milliliter is 100 units or less as a preferable value, 10 units or less as a more preferable value and one unit or less as a most suitable value. For the present invention, the organic substance amount (TOC) per liter is 10 mg or less as a preferable value, 1 mg or less as a more preferable value and 0.2 mg or less as a most suitable value.

As a method for obtaining water of the quality described above, an active charcoal method, a distillation method, an ion exchange method, a filter filtration method, a reverse osmosis method and an ultraviolet ray sterilization method are available. It is preferable to improve the water quality to the required level by combining a plurality of these methods.

If water temperature is excessively high, an oxidized film is formed on the substrate to cause exfoliation of the deposited film. If it is excessively low, the cleaning effect is low and the effect of the present invention cannot be attained. Therefore, for the present invention, an appropriate water temperature is from 10° C. to 90° C. as a preferable value, from 20° C. to 75° C. as a more preferable value, and from 30° C. to 55° C. as a most suitable value.

The surface active agents available for the precleaning step according to the present invention include an anionic surface active agent, a cationic surface active agent, a nonionic surface active agent, an amphoteric surface active agent and a mixture of these surface active agents. Of the above, anionic surface active agents such as carboxylate, sulfonate, sulfate and phosphate or nonionic surface active agents such as fatty acid ester are particularly effective in the present invention. Phosphate, carbonate, silicate, borate or the like can be effectively used as a builder. Gluconate, EDTA, NTA, phosphate or the like can be effectively used as a chelate agent.

The use of ultrasonic waves in the present invention is effective for ensuring the effect of the present invention. An effective frequency of ultrasonic wave is from 100 Hz to 10 MHz as a preferable value, from 1 kHz to 5 MHz as a more preferable value and from 10 kHz to 100 kHz as a most suitable value. An effective output of ultrasonic wave is from 0.1 W/liter to 1 kW/liter as a preferable value and from 1 W/liter to 100 W/liter as a more preferable value.

In the present invention, the quality of water to be used in the cleaning step with water in which carbon dioxide is dissolved is extremely important and is preferably a semiconductor grade purified water and a super LSI grade super purified water in the state before carbon dioxide is dissolved. Specifically, for the present invention, the lower limit value of electrical resistivity at the water temperature of 25° C. is 1 MΩ·cm or more as a preferable value, 3 MΩ·cm or more as a more preferable value, or 5 MΩ·cm or more as a most suitable value, and the upper limit value of resistivity is 17 MΩ·cm or less as a preferable value, 15 MΩ·cm or less as a more preferable value, or 13 Ω·cm or less as a most suitable value from the viewpoint of costs and productivity, though any value up to a theoretical value (18.25 MΩ·cm) is available. In the present invention, a quantity of fine grains of 0.2 μm or more in diameter per milliliter is 10000 pieces or less as a preferable value, 1000 pieces or less as a more preferable value and 100 pieces or less as a most suitable value. For the present invention, a total number of live microbes per milliliter is 100 units or less as a preferable value, 10 units or less as a more preferable value and one unit or less as a most suitable value. For the present invention, the organic substance amount (TOC) per liter is 10 mg or less as a preferable value, 1 mg or less as a more preferable value and 0.2 mg or less as a most suitable value.

As a method for obtaining water of the quality described above, an active charcoal method, a distillation method, an ion exchange method, a filter filtration method, a reverse osmosis method and an ultraviolet ray sterilization method are available. It is preferable to improve the water quality to the required level by combining a plurality of these methods.

Though any quantity up to the saturated solubility of carbon dioxide to be dissolved in water is available in the present invention, foams will be produced and will adhere to the surface of the substrate to result in spot stains thereon when the water temperature changes if the quantity of carbon dioxide is excessive. In addition, the pH value becomes small if the quantity of dissolved carbon dioxide is excessive, and therefore the substrate may be damaged. On the other hand, if the quantity of carbon dioxide is insufficient, the effect of the present invention cannot be attained.

The quantity of carbon dioxide to be dissolved should be optimized in accordance with the treatment conditions while taking the required quality for the substrate into account.

A preferable quantity of carbon dioxide to be dissolved according to the present invention is generally 60% or less of the saturated solubility and a more preferable quantity is 40% or less.

It is practically effective to control the quantity of carbon dioxide to be dissolved according to the present invention in terms of conductivity of pH value. The range of quantity of carbon dioxide to be dissolved in which the effect of the present invention is remarkable under the control in terms of the conductivity is preferably from 2 μS/cm to 40 μS/cm, more preferably from 4 μS/cm to 35 μS/cm, most preferably from 6 μS/cm to 30 μS/cm, and under the control in terms of the pH value is preferably from 3.8 to 6.0 and more preferably from 4.0 to 5.0. The conductivity is measured with a conductivity meter and a value converted at 25° C. according to temperature compensation is used.

If water temperature is excessively high, an oxidized film is formed on the substrate to cause exfoliation of the deposited film. If it is excessively low, the cleaning effect is low and the effect of the present invention cannot be attained. Therefore, for the present invention, an appropriate water temperature is from 10° C. to 90°C. as a preferable value, from 20°C. to 75°C. as a more preferable value, and from 30° C. to 55° C. as a most suitable value.

A bubbling method and a method using a diaphragm are available for dissolving carbon dioxide in water. In the present invention, it is important to use water in which carbon dioxide is dissolved and, if carbonate such as sodium carbonate is used to obtain carbonate ion, the effect of the present invention is impaired by cation such as sodium ion.

A dipping method and a water spraying method are available for cleaning the substrate surface with water containing dissolved carbon dioxide thus obtained.

For cleaning the substrate by the dipping method, the substrate is basically immersed into a bath filled with water in which carbon dioxide has been dissolved. In this case, the present invention will be more effective by simultaneously applying ultrasonic waves, water stream and bubbling with introduction of air.

If the water pressure in the water spraying method is excessively low, the effect of the present invention will be small and, if it is excessively high, a pear skin pattern will appear on an image, particularly, a half-tone image of the electrophotographic photosensitive member obtained. In the present invention, therefore, an appropriate water pressure is preferably from 2 kg f/cm$^2$ to 300 kg f/cm$^2$, more preferably from 10 kg f/cm$^2$ to 200 kg f/cm$^2$, and most suitably from 20 kg f/cm$^2$ to 150 kg f/cm$^2$. However, the pressure unit "kg f/cm$^2$" in the present invention means a gravity kilogram per centimeter square and 1 kg·f/cm$^2$ is equivalent to 98066.5 Pa.

The water spraying method is such that high-pressurized water in a pump is sprayed from nozzles or water pumped up by a pump is mixed with high pressure air in front of the nozzles and sprayed by a pneumatic pressure.

An appropriate flow rate of water for each substrate is preferably from one liter/min. to 200 liters/min., more preferably from 2 liters/min. to 100 liters/min., most suitably from 5 liters/min. to 50 liters/min.

If water temperature is excessively high, an oxidized film is formed on the substrate to cause exfoliation of the deposited film and the effect of the present invention cannot be fully attained. It is difficult to make carbon dioxide stably dissolved in water. On the contrary, if water temperature is excessively low, the effect of the present invention cannot also be fully attained as described above. In the present invention, therefore, a desirable water temperature is preferably from 5° C. to 90° C., more preferably from 10° C. to 55° C., and most suitably from 15° C. to 40° C.

If the treating time in cleaning the substrate with water in which carbon dioxide has been dissolved is excessively long, an oxidized film is formed on the substrate and, if it is excessively short, the effect of the present invention will be insufficient. Therefore a desirable treating time in water cleaning is preferably from 10 seconds to 30 minutes, more preferably from 20 seconds to 20 minutes and most suitably from 30 seconds to 10 minutes.

In the present invention, it is important to carry out cutting of the substrate surface shortly before the deposited film is formed to remove the effect of the oxide film or the like on the substrate surface which has been formed upon formation of the deposited film.

If a time from cutting to cleaning with water containing dissolved carbon dioxide is excessively long, the oxide film is formed again on the substrate surface and, if it is excessively short, the steps will be unstable. Therefore an appropriate time is preferably from 1 minute to 16 hours, more preferably from 2 minutes to 8 hours and most suitably from 3 minutes to 4 hours.

If a time from cleaning treatment with water containing dissolved carbon dioxide to feeding into the deposited film forming apparatus is excessively long, the effect of the present invention will be small and, if it is excessively short, the steps will be unstable. Therefore, in the present invention, an appropriate time is preferably from 1 minute to 8 hours, more preferably from 2 minutes to 4 hours, and most suitably from 3 minutes to 2 hours.

Any of hot air drying, vacuum drying, hot water drying and the like is effective as a drying step in the present invention. Drying with hot water in which carbon dioxide is dissolved is particularly preferable to raise the effect of the present invention.

In the present invention, the quality of water to be used in the hot water drying step with water in which carbon dioxide is dissolved is extremely important and is preferably a semiconductor grade purified water and a super LSI grade super purified water in the state before carbon dioxide is dissolved. Specifically, for the present invention, the lower limit value of electrical resistivity at the water temperature of 25° C. is 1 MΩ·cm or more as a preferable value, 3 MΩ·cm or more as a more preferable value, or 5 MΩ·cm or more as a most suitable value, and the upper limit value of resistivity is 17 MΩ·cm or less as a preferable value, 15 MΩ·cm or less as a more preferable value, or 13 MΩ·cm or less as a most suitable value from the viewpoint of costs and productivity, though any value up to a theoretical value (18.25 MΩ·cm) is available. In the present invention, a quantity of fine grains of 0.2 $\mu$m or more in diameter per milliliter is 10000 pieces or less as a preferable value, 1000 pieces or less as a more preferable value and 100 pieces or less as a most suitable value. For the present invention, a total number of live microbes per milliliter is 100 units or less as a preferable value, 10 units or less as a more preferable value and one unit or less as a most suitable value. For the present invention, the total organic carbon (TOC) per liter is 10 mg or less as a preferable value, 1 mg or less as a more preferable value and 0.2 mg or less as a most suitable value.

As a method for obtaining water of the quality described above, an active charcoal method, a distillation method, an ion exchange method, a filter filtration method, a reverse osmosis method and an ultraviolet ray sterilization method are available. It is preferable to improve the water quality to the required level by combining a plurality of these methods.

The water is desired to contain dissolved carbon dioxide; and although any quantity up to the saturated solubility of carbon dioxide to be dissolved in water is available in the present invention, foams will be produced and will adhere to the surface of the substrate to result in spot stains thereon when the water temperature changes if the quantity of carbon dioxide is excessive. In addition, the pH value becomes small if the quantity of dissolved carbon dioxide is excessive, and therefore the substrate may be damaged. On the other hand, if the quantity of carbon dioxide is insufficient, the effect of ensuring to obtain the uniform substrate surface cannot be improved.

The quantity of carbon dioxide to be dissolved should be optimized in accordance with the treatment conditions while taking the required quality for the substrate into account.

A preferable quantity of carbon dioxide to be dissolved according to the present invention is generally 60% or less of the saturated solubility and a more preferable quantity is 40% or less.

It is practically effective to control the quantity of carbon dioxide to be dissolved according to the present invention in terms of conductivity or pH value. The range of quantity of carbon dioxide to be dissolved in which the effect of the present invention is remarkable under the control in terms of the conductivity is preferably from 2 $\mu$S/cm to 40 $\mu$S/cm and more preferably from 4 $\mu$S/cm to 35 $\mu$S/cm, most preferably from 6 $\mu$S/cm to 30 $\mu$S/cm, and under the control in terms of the pH value is preferably from 3.8 to 6.0 and more preferably from 4.0 to 5.0. The conductivity is measured with a conductivity meter and a value converted to at 25° C.

A bubbling method and a method using a diaphragm are available for dissolving carbon dioxide in water as described above. In the present invention, it is important to use water in which carbon dioxide is dissolved and, if carbonate such as sodium carbonate is used to obtain carbonate ion, the effect of the present invention is impaired by cation such as sodium ion.

If water temperature is excessively high, an oxidized film is formed on the substrate to cause exfoliation of the deposited film. If it is excessively low, drying is insufficient and the effect of the present invention cannot be attained. Therefore, in the present invention, an appropriate water temperature is from 30° C. to 90° C. as a preferable value, from 35° C. to 80° C. as a more preferable value, and from 40° C. to 70° C. as a most suitable value.

There is no limitation for the ceramic material constituting the inner surface 203 of the substrate holder 202; for example, $Al_2O_3$, $Cr_2O_3$, MgO, $TiO_2$ and $SiO_2$ may be employed. Above all, $Al_2O_3$, $TiO_2$ and $SiO_2$, which are excellent acid resistant materials, are preferable also in view of the corrosion resistance to halogen containing compound gas (such as $F_2$, $ClF_3$ and $SiF_4$) that is used in the production step of the light-receiving member containing a-Si (amorphous material comprising Si as the base material). A material susceptible to heat radiation such as $Cr_2O_3$ is also preferable since some quality change in the surface affects the material very little. More preferable material is a mixture of what is excellent in acid resistance and what is susceptible to heat radiation.

When a mixed material is employed, the mixture ratio is preferably in the range of a:b=1:99 through 99:1, more preferably 10:90 through 90:10 where a is the weight of the excellent acid resistance material and b is the weight of the radiation heat susceptible material respectively expressed in gram.

The porosity of the ceramic material that constitutes the inner surface 203 of the substrate holder 202 is preferably 1 through 20%, more preferably 1 through 15% for improvement of the heat resistance and prevention of moisture absorption.

The surface of the ceramic constituting the inner surface 203 of the substrate holder 202 is preferably a coarse one for increasing the surface area and increasing the heat radiation efficiency. On the other hand, a too coarse surface with excessive surface area makes dust. Preferable surface roughness is preferably 5–200 $\mu$m, more preferably 10–90 $\mu$m, as the 10 points average roughness (Rz). While uniform roughness in the whole inner surface is preferable, the difference between the maximum and minimum values not exceeding 100 $\mu$m is acceptable in practice.

While there is no limitation in the means for forming the inner surface 203 of the substrate 202 with a ceramic material, CVD method, metal plating, thermal spraying, or other surface coating may be applied. Above all, thermal spraying is preferable because of low cost and because the size and shape of the object to be coated are less limiting; plasma spraying, in particular, is most preferable because of the low porosity and excellent adhesion. Alternatively, a cylinder made of a ceramic material, for example, may be fitted intimately to the inner surface of the metallic substrate holder.

While forming the inner surface 203 of the substrate holder 202 with a ceramic material is made on to the metal surface by abovementioned means after the inner surface is made clean, it is preferable to install an underlayer, between the ceramic and the metal surface, that is made of a mixed material of Al and Ti for example.

Although the ceramic material preferably covers the whole inner surface 203 of the substrate holder 202, it is permissible leave a part uncovered, for the purpose of grounding the substrate holder for example.

The thickness of ceramic material constituting the inner surface 203 of the substrate holder 202 has no limitation actually, however, 10–10000 $\mu$m is preferable (more preferably 20–5000 $\mu$m) in view of enhancement of durability and uniformity, heat transfer, and production cost.

The only requirement of the substrate holder 202 is that the matrix should be metal; a metal such as Al, Cr, Mo, Au, Ti, Nb, Pd, Fe, or an alloy of them such as stainless steel may be suitably employed. However, in consideration of cost, weight, durability, and processability to form into the shape of the substrate holder 202, Al, an alloy mainly comprising Al, and stainless steel are preferable.

The substrate holder comprising the same metal or alloy thereof as the metal of the substrate for forming the deposited film is preferable since the volume change caused by thermal expansion is same as the substrate; thereby, firm fitness between the substrate and its holder is secured and distance between the substrate and its holder is kept stable. Under such situation, uniformity of the deposited film becomes excellent because strain in the substrate hardly develops and electrical contact between the substrate and its holder is kept well.

The thickness (wall thickness) of the substrate holder 202 is not limited specifically unless deformation should develop while the substrate is held. As a matter of practice, however, in consideration of cost, handling, strength, heating period and heating temperature, the thickness is preferably 0.5–30 mm, more preferably 1–20 mm.

The substrate holder 202 is workable so long as formed in the part facing to the substrate 201, however, longer formation than the substrate 201 is preferred because of the film uniformity and handling easiness. The length of the substrate holder 202 is preferably 100–200, more preferably 100–170 against 100 of the substrate length in view of the cost and other factors, although it depends on apparatus to be fitted and may vary, in the case that one substrate holder is provided with one substrate. Where a plurality of substrates are provided for one substrate holder, the total length of the plurality of deposited films to be formed should satisfy above relationship.

The substrate holder is preferably provided with a handhold 207 as shown in FIG. 3 for transportation of itself and the substrate; various shapes such as convex or concave may be adopted if the chucking for transportation is made exactly and firmly.

In the present invention, any kind of material is available for the substrate as far as it uses aluminum as the matrix and the effect of the present invention is particularly remarkable if the material containing silicon atoms is used. In the present invention, an appropriate content of silicon atoms is preferably from 1 ppm to 1 wt % and more preferably from 10 ppm to 0.1 wt %.

In the present invention, it is effective to contain magnesium to improve workability of the substrate. An appropriate content of magnesium is preferably from 0.1 wt % to 10 wt % and more preferably from 0.2 wt % to 5 wt %.

In addition, in the present invention, it is effective to contain such substances as H, Li, Na, K, Be, Ca, Ti, Cr, Mn, Fe, Co, Ni, Cu, Ag, Zn, Cd, Hg, B, Ca, In, C, Si, Ge, Sn, N, P, As, O, S, Se, F, Cl, Br, and I in aluminum.

In the present invention, the substrate can be formed in any shape and particularly a cylindrical form is best suited to the present invention. Though the size of the substrate is not limited, it is preferable for practical use to be from 20 mm to 500 mm in diameter and from 10 mm to 1000 mm in length.

For non-monocrystalline photosensitive member containing silicon, starting gases such as silane ($SiH_4$), disilane ($Si_2H_6$), silicon tetra fluoride ($SiF_4$) and disilicon hexafluoride ($Si_2F_6$) or a mixture of these gases are available as the starting gas to be used in formation of the deposited film.

Hydrogen ($H_2$), argon (Ar) and helium (He) are available as a diluted gas.

As a characteristic improving gas for changing a band gap width of the deposited film is available a gas containing nitrogen atoms such as nitrogen ($N_2$) and ammonia ($NH_3$), a gas containing oxygen atoms such as oxygen ($O_2$), nitrogen monoxide (NO), nitrogen dioxide ($NO_2$), nitrous oxide ($N_2O$), carbon monoxide (CO) and carbon dioxide ($CO_2$), hydrocarbon such as methane ($CH_4$), ethane ($C_2H_6$), ethylene ($C_2H_4$), acetylene ($C_2H_2$) and propane ($C_3H_8$), fluorides such as germanium tetrafluoride ($GeF_4$) and nitrogen fluoride ($NF_3$) or a mixture of these gases.

In the present invention, a similar effect is obtained by simultaneously introducing dopant gases such as diborane ($B_2H_6$), boron fluoride ($BF_3$) and phosphine ($PH_3$) for the purpose of doping.

In the case of the electrophotographic photosensitive member according to the present invention, though the total film thickness of the functional deposited film deposited on the substrate can be as required, particularly satisfactory images can be obtained on the electrophotographic photosensitive member when the total film thickness is preferably from 5 $\mu$m to 100 $\mu$m, more preferably from 10 $\mu$m to 70 $\mu$m and most suitably from 15 $\mu$m to 50 $\mu$m.

In the present invention, the range of the temperature of the substrate in formation of the deposited film can be, for example, from 100° C. to 500° C. and a remarkable effect of the present invention can be recognized when the temperature of the substrate is preferably from 150° C. to 450° C., more preferably from 200° C. to 400° C., and most suitably from 250° C. to 350° C.

In the present invention, the energy for generating the plasma to be used to form the functional film is available in any term of DC, RF or microwave. Particularly, when the microwave is used as the energy for generating the plasma, abnormal growth due to a surface defect of the substrate remarkably occurs, the microwave is absorbed by water adsorbed and a change of the interface becomes more remarkable and therefore the effect of the present invention will be more remarkable.

An electrophotographic photosensitive member prepared by the method of the present invention is used for not only an electrophotography but also an electrophotographic applied field such as a laser beam printer, a CRT printer, an LED printer, a liquid crystal printer, a laser makeup machine and the like.

The effects of the present invention will be explained as bellow by referring concrete examples, but the present invention is never limited to them.

EXPERIMENT 1

Figure 7A:
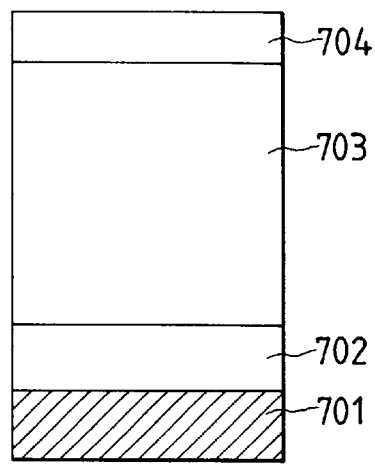
FIGS. 7A, 7B and 7C are sectional views respectively showing the layer compositions of an electrophotographic photosensitive member.

Amorphous silicon deposited film was formed on a substrate under the condition of Table 1 by using the apparatus for forming deposited film shown in FIG. 4 to manufacture a blocking type electrophotographic photosensitive member having layers whose structure is shown in FIG. 7A. In FIG. 7A, reference numerals 701, 702, 703 and 704 denote aluminum substrate, charge blocking layer, photoconductive layer and surface layer respectively in this order. A cylindrical substrate of aluminum containing 100 ppm silicon atom having a size of 108 mm in diameter, 358 mm in length and 5 mm in thickness was subjected to the cutting of the surface in the same procedures as described above for one example of manufacturing electrophotographic photosensitive member according to the present invention and used as the substrate.

In this experiment, electrophotographic photosensitive member was manufactured under the following six conditions.

Condition 1

Fifteen minutes after the completion of cutting step, cleaning by a detergent (nonionic surfactant) followed by cleaning with water containing dissolved carbon dioxide was done by using surface treatment apparatus shown in FIG. 2 under the conditions shown in Table 2. The water containing dissolved carbon dioxide was prepared by dissolving carbon dioxide in pure water of 10 M$\Omega$·cm electrical resistivity to obtain water with 20 $\mu$S/cm conductivity and approximately 4.2 of pH. Then the cylindrical substrate was set on the substrate holder with the shape, size and dimensions shown in Table 3A to prepare an electrophotographic photosensitive member.

Condition 2

Fifteen minutes after the completion of cutting step, cleaning by a detergent (nonionic surfactant) followed by cleaning with pure water was done under the conditions shown in Table 4. The surface treatment apparatus was one shown in FIG. 1 into whose cleaning vessel 131 pure water not containing dissolved carbon dioxide was introduced. Then the cylindrical substrate was set on the substrate holder with the shape, size and dimensions of Table 3A to prepare electrophotographic photosensitive member.

Condition 3

Figure 8:
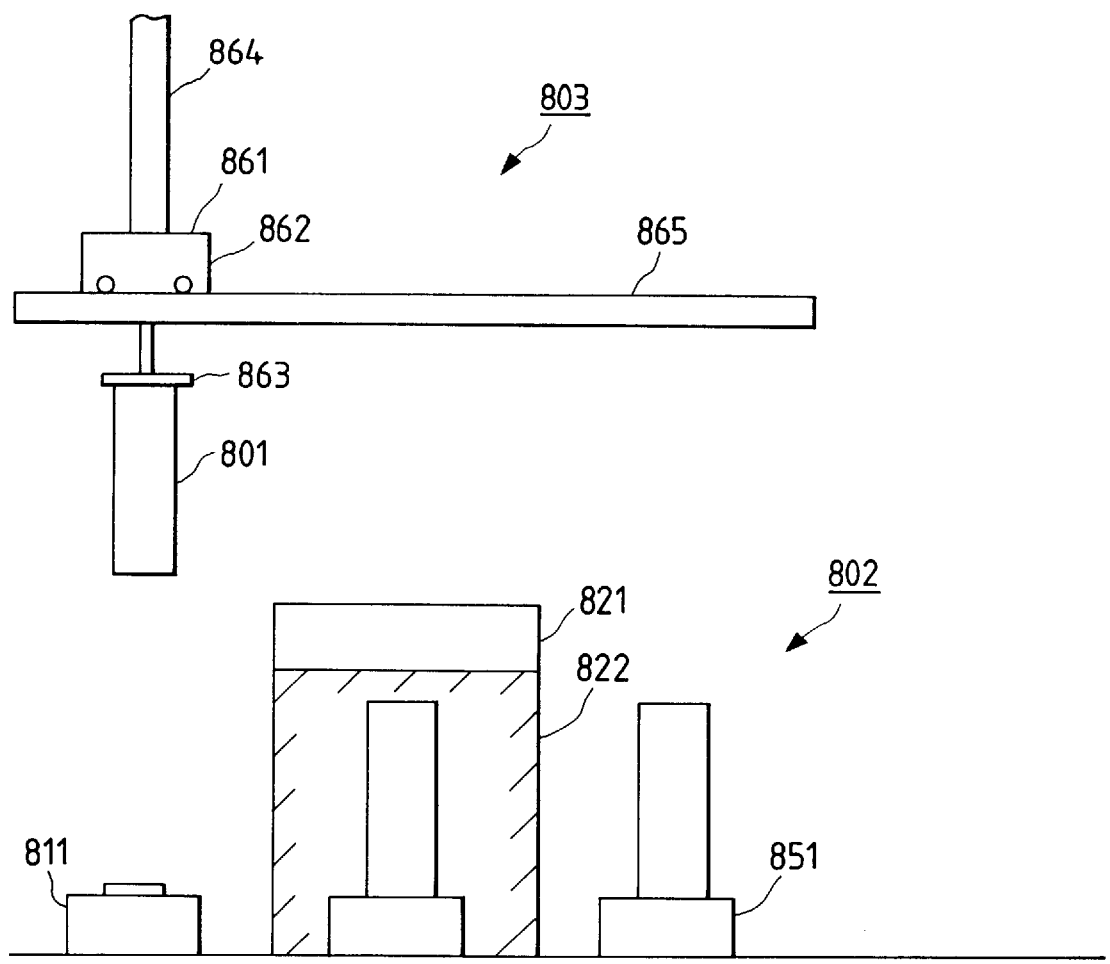
FIG. 8 is a schematic vertical sectional view of a conventional cleaning apparatus for cleaning a substrate as a pretreatment for a deposited film formation.

Fifteen minutes after the completion of cutting step, the surface of the substrate was treated by substrate surface cleaning apparatus shown in FIG. 8 under the conditions of Table 5. The substrate surface cleaning apparatus shown in FIG. 8 comprises a treatment vessel 802 and a substrate transport system 803. The treatment vessel 802 comprises substrate loader 811, substrate cleaning vessel 821 and substrate unloader 851. The cleaning vessel 821 is equipped with a temperature control device (not shown) to maintain temperature of the liquid constant. The substrate transport system 803 comprises a transport rail 865 and transport arm 861. The transport arm 861 comprises a moving mechanism 862 moving along rail 865, chucking system 863 that holds the substrate 801 and an air cylinder 864 that moves the chucking system 863 vertically.

After cutting, the substrate 801 placed on the loader 811 is delivered into the cleaning vessel 821 by delivery system 803. Cleaning is made with trichloroethane (trade name: ETERNA VG made by Asahi Chemical Industry Co., Ltd.) 822 in the cleaning vessel 821 to remove cutting oil and chip adhered to the surface of the substrate 801.

After cleaning, the substrate 801 is moved to the unloader 851 by the transport system 803.

Then, the cylindrical substrate was set on the substrate holder with the shape, size and dimensions shown in Table 3A to prepare an electrophotographic photosensitive member.

Condition 4

Fifteen minutes after the completion of cutting step, cleaning by a detergent (nonionic surfactant) followed by cleaning with water containing dissolved carbon dioxide was done by using the surface treatment apparatus shown in FIG. 2 under the conditions shown in Table 2. The water containing dissolved carbon dioxide was prepared by dissolving carbon dioxide in pure water of 10 μS/cm electrical resistivity to obtain water with 20 μS/cm conductivity and approximately 4.2 of pH. Then the cylindrical substrate was set on the substrate holder with the shape, size and dimensions of Table 3E to prepare an electrophotographic photosensitive member.

Condition 5

Fifteen minutes after the completion of cutting step, cleaning by a detergent (nonionic surfactant) followed by pure water was made under the conditions shown in Table 4. The surface treatment apparatus was one shown in FIG. 2 into whose cleaning vessel 131 pure water not containing dissolved carbon dioxide was introduced. Then the cylindrical substrate was set on the substrate holder with the shape, size and dimensions shown in Table 3E to prepare an electrophotographic photosensitive member.

The electrophotographic photosensitive member prepared was set on an electrophotographic apparatus that is modified from NP-6060, a copying machine made by Canon, for high speed experiment. The characteristics of the electrophotograph evaluated were chargeability, unevenness in the chargeability, sensitivity, sensitivity unevenness, image density unevenness, and white spots. In addition, evaluation was made concerning the number of spherical projections on the surface of the photosensitive member, environmental factor and the internal surface conditions of the substrate as well.

Evaluation for respective items were made as follows.

(1) Chargeability and Unevenness in the Chargeability

The electrophotographic photosensitive member was set on the experimental apparatus; high electric voltage of +6 KV was applied to the charger and corona discharge was made to measure the dark surface potential of the electrophotographic photosensitive member using surface potential meter. Measurement of the dark surface potential was made at every 3 cm interval along one end of the electrophotographic photosensitive member to the other end. Similar measurement was made at every 45 degree in 8 peripheral directions. The average value of the dark surface potential values determined was used as the value of chargeability and the unevenness in the chargeability was expressed by the variance (standard deviation).

(2) Sensitivity and Sensitivity Unevenness

The electrophotographic photosensitive member was charged to 420 V of dark surface potential. And a given amount of light was immediately irradiated on the electrophotographic photosensitive member. The light source was xenon lamp. Light of wave length of 550 nm or less was removed by using a filter and the remaining light was irradiated. At this time the bright surface potential of electrophotographic photosensitive member was measured by a surface potential meter. Measurement of the bright surface potential was made at every 3 cm interval along the length of the electrophotographic photosensitive member. Similar measurement was made at every 45 degree in 8 peripheral directions. The average of the bright surface potential values measured is used as the value of sensibility and variance (standard deviation) is used as the value of sensitivity unevenness.

The amount of light at this evaluation was 0.35 lx·sec.

(3) Image Density Unevenness

First, halftone chart made by Canon (Part Number FY-9042) was copied. Density of image was then measured at 200 points with unit circle area of 0.05 mm diameter on the image copied. Variance of printed image density was evaluated.

⊚—especially good

○—good

Δ—practically no problem

×—may cause problems in practice.

(4) White Spot

Overall black chart made by Canon (Part Number: FY9-9073) was copied at first. Then white spots having diameter smaller than 0.2 mm in the same whole area of image copied were evaluated.

⊚—especially good

○—good

Δ—practically no problem

×—may cause problems in practice.

(5) The Number of Spherical Projections

The whole area of electrophotographic photosensitive member was observed by optical microscope to count the number of spherical projections having diameter bigger than 15 μm per 100 cm² area.

(6) Evaluation of Environmental Factor

○—Such materials as were allegedly concerned in breakdown of ozone layer were not used in pretreatment step.

×—Such materials as were allegedly concerned in breakdown of ozone layer were used in pretreatment step.

(7) Internal Surface State of the Substrate

The internal surface of the substrate was visually observed by human eye to evaluate its state in comparison with the internal surface state of the substrate before formation of deposited film, by following criterion.

⊚—no change found

○—slight change of color observed

Δ—change of color in spots observed

×—big change of color observed.

The results obtained in this manner were shown in Table 6. In Table 6, chargeability, unevenness in chargeability, sensitivity, sensitivity unevenness and the number of spherical projections on the surface of the photosensitive member were shown as relative evaluation in comparison with the results obtained under Condition 5 that were 100 or control.

As apparently shown in Table 4, it was made possible that great improvement was brought about in the results of image and image density unevenness by cleaning the substrate with water containing dissolved carbon dioxide and also by using the substrate holder whose internal surface was composed of ceramics, for production of electrophotographic photosensitive member.

TABLE 1

| Layer name | Used gas and flow rate (sccm) | RF power (W) | Internal power (Torr) | Substrate temperature (°C) | Layer thickness (μm) |
|---|---|---|---|---|---|
| Charge blocking layer | SiH$_4$ 180<br>H$_2$ 300<br>B$_2$H$_6$ 1800 ppm (Based on SiH$_4$)<br>NO 8 | 300 | 0.3 | 290 | 3 |
| Photosensitive layer | SiH$_4$ 500<br>H$_2$ 300<br>B$_2$H$_6$ 0.2 ppm (Based on SiH$_4$) | 500 | 0.3 | 290 | 20 |
| Surface layer | SiH$_4$ 50<br>CH$_4$ 600 | 300 | 0.4 | 290 | 0.5 |

TABLE 2

| Treatment conditions | Pre-cleaning | Cleaning with aqueous carbon dioxide solution | Drying |
|---|---|---|---|
|  | Aqueous detergent solution | Aqueous carbon dioxide solution (Conductivity :20 μS/cm) | Air |
| Temperature | 30° C. | 25° C. | 80° C. |
| Pressure |  |  | 5 kg.f/cm$^2$ |
| Treating time | 3 min | 1 min | 1 min |
| Others |  | Ultrasonic treatment |  |

TABLE 3

|  | Substrate holder material | Shape, dimension | Internal surface of substrate holder |
|---|---|---|---|
| 3A | JIS5000 series Aluminum alloy | Fundamental structure of FIG. 2<br>Inside diameterø 92 mm<br>Length 560 mm<br>Center thickness 2 mm | Al$_2$O$_3$:Cr$_2$O$_3$ =1:1<br>Plasma spraying<br>Thickness |

TABLE 3-continued

|  | Substrate holder material | Shape, dimension | Internal surface of substrate holder |
|---|---|---|---|
|  |  | Auxiliary substrate length | 50 μm |
|  |  | Upper part 50 mm<br>Lower part 160 mm<br>Auxiliary substrate length |  |
| 3E | ditto | Upper part 5 mm<br>Lower part 5 mm<br>ditto | Without ceramic coating (JIS5000 series aluminum alloy) |

TABLE 4

| Treatment conditions | Pre-cleaning | Cleaning | Drying |
|---|---|---|---|
|  | Aqueous detergent solution | Purified water (Electrical resistivity: 10MΩ-cm) | Air |
| Temperature | 30° C. | 25° C. | 80° C. |
| Pressure |  |  | 5 kg.f/cm$^2$ |
| Treating time | 3 min | 1 min | 1 min |
| Others |  | Ultrasonic treatment |  |

TABLE 5

|  | cleaning |
|---|---|
| Treating agent | Triethane |
| Temperature | 50° C. |
| Treating time | 3 min |
| Others | Ultrasonic treatment |

TABLE 6

| Conditions | Charge ability | Unevenness in charge ability | Sensitivity | Unevenness in sensitivity | Unevenness in image density | White spots | Spherical projection | Environmental properties | Internal conditions |
|---|---|---|---|---|---|---|---|---|---|
| 1 | 121 | 55 | 62 | 49 | ⊙ | ⊙ | 47 | ○ | ⊙ |
| 2 | 100 | 92 | 97 | 83 | ○ | ○ | 82 | ○ | Δ |
| 3 | 99 | 91 | 96 | 82 | ○ | ○ | 81 | X | Δ |
| 4 | 116 | 89 | 93 | 88 | ○ | ○ | 79 | ○ | Δ |
| 5 | 100 | 100 | 100 | 100 | Δ | Δ | 100 | ○ | X |

EXPERIMENT 2

Investigation was made on correlation between varied amount of carbon dioxide dissolved in water and occurrence of defects on image. The surface of a cylindrical substrate of aluminum containing 100 ppm silicon atom was cut in the same procedures as described above for preparing electrophotographic photosensitive member in the present invention. The dimensions of the substrate were 108 mm in diameter, 358 mm in length and 5 mm in thickness.

Fifteen minutes after the completion of cutting step, cleaning by a detergent (nonionic surfactant) followed by cleaning with water containing dissolved carbon dioxide was done by using surface treatment apparatus shown in FIG. 2 under the conditions shown in Table 2. The water containing dissolved carbon dioxide was prepared by dissolving various amount of carbon dioxide in pure water of 10 MΩ·cm electrical resistivity to obtain water with eleven levels of conductivity ranging between 0.1 $\mu$S/cm and 50 $\mu$S/cm.

Then the cylindrical substrate was set on substrate holder with the shape, size and dimensions of Table 3A. Amorphous silicon deposited film was formed on substrate under the condition of Table 1 by using apparatus for forming deposited film shown in FIG. 4 to make blocking type electrophotographic photosensitive member having layers whose structure was shown in FIG. 7A.

The electrophotographic photosensitive member produced in this manner was evaluated in the same way as that of Experiment 1. The evaluation results were shown in Table 7. In Table 7, chargeability, unevenness in chargeability, and the number of spherical projections on the surface of the photosensitive member were shown as relative evaluation in comparison with the results obtained in the case of 0.1 $\mu$S/cm conductivity (pure water only, or no carbon dioxide dissolved) that were 100 or control.

As apparently shown in Table 7, very good effect was obtained on the defects of image of the electrophotographic photosensitive member produced by the production method of the electrophotographic photosensitive member according to the present invention in case that conductivity of aqueous solution dissolving carbon dioxide ranged between 2 $\mu$S/cm and 40 $\mu$S/cm.

TABLE 7

| Conductivity ($\mu$S/cm) | Charge ability | Unevenness in charge ability | White spots | Spherical projection |
|---|---|---|---|---|
| 0.1 (Without CO$_2$) | 100 | 100 | ○ | 100 |
| 1 | 101 | 78 | ○ | 87 |
| 2 | 105 | 71 | ◎ | 79 |
| 4 | 111 | 69 | ◎ | 70 |
| 6 | 119 | 68 | ◎ | 66 |
| 10 | 121 | 61 | ◎ | 65 |
| 15 | 120 | 60 | ◎ | 62 |
| 30 | 121 | 61 | ◎ | 64 |
| 35 | 115 | 63 | ◎ | 71 |
| 40 | 109 | 63 | ◎ | 79 |
| 50 | 104 | 64 | ○ | 87 |

EXPERIMENT 3

Investigation was made on correlation between varied amount of silicon atoms contained in aluminum of substrate and occurrence of defects on image. The content of silicon atoms in aluminum varied at 8 levels ranging between 0% (or not contained) and 1.5 wt %. Such 8 aluminum substrates were cut in the same procedures as those of Experiment 1. Fifteen minutes after the completion of cutting step, cleaning by water containing dissolved carbon dioxide was done by using surface treatment apparatus shown in FIG. 2 under the conditions shown in Table 2. The water containing dissolved carbon dioxide was prepared by dissolving various amount of carbon dioxide in pure water of 10 MΩ·cm electrical resistivity to water with conductivity of 20 $\mu$S/cm and pH of approximately 4.2.

Then the cylindrical substrate was set on substrate holder with the shape, size and dimensions of Table 3A. Amorphous silicon deposited film was formed on the substrate under the condition of Table 1 by using apparatus for forming deposited film shown in FIG. 4 to make blocking type electrophotographic photosensitive member having layers whose structure was shown in FIG. 7A.

The electrophotographic photosensitive member produced in this manner was evaluated in the same way as that of Experiment 1. The evaluation results were shown in Table 8. As apparently shown in Table 8, very good effect was obtained on the defects of image of the electrophotographic photosensitive member produced by the production method of the electrophotographic photosensitive member according to the present invention in case that silicon atoms contained in aluminum of substrate ranged between 1 ppm and 1 wt %.

TABLE 8

| Si content | White spots |
|---|---|
| 0 ppm | Δ |
| 0.7 ppm | ○ |
| 1 ppm | ◎ |
| 10 ppm | ◎ |
| 100 ppm | ◎ |
| 0.1 wt % | ◎ |
| 1 wt % | ◎ |
| 1.5 wt % | Δ |

EXPERIMENT 4

The same substrate as that of Experiment 1 was cut in the same procedures as those of Experiment 1. Fifteen minutes after the completion of cutting step, pretreatment of substrate surface was done by using surface treatment apparatus shown in FIG. 2 under the conditions shown in Table 2.

Then the cylindrical substrate was set on substrate holder with the shape, size and dimensions of Table 3A. Amorphous silicon deposited film was formed on substrate under the condition of Table 1 by using apparatus for forming deposited film shown in FIG. 4 to make blocking type electrophotographic photosensitive member having layers whose structure was shown in FIG. 7A.

In this experiment, investigation was made by varying quality (electrical resistivity) of pure water for the step of cleaning by water containing dissolved carbon dioxide and occurrence of defects on printed image.

Electrophotographic photosensitive members were prepared by varying quality (electrical resistivity) of the pure water for cleaning process. The electrophotographic photosensitive member produced in this manner was evaluated in the same procedures and the same way as those of Experiment 1. In more details, ten electrophotographic photosensitive members for each water quality level were produced by the same production method. Then all the ten electrophotographic photosensitive members for each water quality level were evaluated. The evaluation results were shown in Table 9, in which following criteria were used for dark stain and cost.

Evaluation of Dark Stain

First, overall halftone chart was copied by varying process speed so that the average density of image may lie in the range of 0.4±0.1. The most stained image sample among the each ten samples was selected for evaluation which was made basically based on visual observation by human eye. Distance between image and eye for observation was kept 40 cm to examine whether or not dark stain was recognized. Following criterion was used.

⊚—no dark stain on any copy observed

○—slightly dark stain on some copies recognized, but too slight to be a problem at all Δ—dark stain on any copy recognized, but too slight to be a problem from practical point of view ×—big dark stains on all the copies observed.

Evaluation of Cost

Required quantity of required cleaning liquid may or must be purchased

⊚—at very inexpensive cost

○—at inexpensive cost

Δ—at relatively expensive cost

×—at expensive cost.

As apparently shown in Table 9, very good result was obtained on the quality of image of the electrophotographic photosensitive member produced by the production method of the electrophotographic photosensitive member according to the present invention in case that electrical resistivity of pure water for the process of cleaning by water containing dissolved carbon dioxide exceeded 1 MΩ·cm before dissolving carbon dioxide.

TABLE 9

| Electrical Resistivity (MΩ.cm) | White spots | Black spots | Cost |
|---|---|---|---|
| 0.7 (Without CO$_2$) | ○ | Δ | ⊚ |
| 1 | ⊚ | ⊚ | ⊚ |
| 3 | ⊚ | ⊚ | ⊚ |
| 5 | ⊚ | ⊚ | ⊚ |
| 13 | ⊚ | ⊚ | ⊚ |
| 15 | ⊚ | ⊚ | ○ |
| 17 | ⊚ | ⊚ | Δ |
| 18 | ⊚ | ⊚ | × |

EXPERIMENT 5

The substrate surface was cut in the same procedures for preparing electrophotographic photosensitive member according to the present invention. The substrate was a cylindrical substrate of aluminum containing 100 ppm of silicon atom. The dimensions of the substrate were 108 mm in diameter, 358 mm in length and 5 mm in thickness.

Fifteen minutes after the completion of cutting step, cleaning by a detergent (nonionic surfactant) followed by cleaning with water containing dissolved carbon dioxide was done by using surface treatment apparatus shown in FIG. 2 under the conditions shown in Table 2. The water containing dissolved carbon dioxide was prepared by dissolving an amount of carbon dioxide in pure water of 10 MΩ·cm resistivity to obtain aqueous solution with conductivity of 20 µS/cm and with pH of approximately 4.2.

Then each of five cylindrical substrates was set respectively on substrate holders A–E with the shape, size and dimensions of Table 10. Amorphous silicon deposited film was formed on the substrate under the condition of Table 2 by using apparatus for forming deposited film shown in FIG. 4 to make blocking type electrophotographic photosensitive member having layers whose structure was shown in FIG. 7A.

(1) Electrophotographic photosensitive member prepared was set on an electrophotographic apparatus modified from NP-6060, a copying machine produced by Canon, for high speed experiment. The characteristics of the electrophotograph evaluated were chargeability unevenness, sensitivity unevenness, image density unevenness, etc. In addition, evaluation similar to that of Experiment 1 was made concerning the number of spherical projections on the surface of the photosensitive member, too.

(2) Secondly, more electrophotographic photosensitive members had continuously be produced at each substrate holder. At every time the inside of vacuum reaction vessel was etched by mixed gas of ClF$_3$ and Ar to remove residual product in the vacuum reaction vessel. The 40th electrophotographic photosensitive member produced was given evaluation similar to that of (1) above.

(3) Then the 40th electrophotographic photosensitive member produced was set on an electrophotographic apparatus modified from NP-6060, a copying machine produced by Canon, for experiment to do two million copy test for durability. In addition, evaluation similar to that of (1) above was made concerning the characteristics of the electrophotograph such as sensitivity unevenness, image density unevenness, etc., too.

The results thus obtained were shown respectively in Table 11 for (1) and Table 12 for (2) and (3).

As apparently shown in Table 11, it was made clear that the method of forming photosensitive member according to the present invention could produce such photosensitive member that could greatly decrease the number of spherical projections and reduce the image defects. In addition, uniformity in the characteristics was very good.

As apparently shown in Table 12, it was made clear that the photosensitive member with good uniformity and less image defects could be produced even after long period use of the substrate holder.

Good results were obtained especially when acid-proof material was used or when material used could easily receive radiation heat. Furthermore, the mixed use of both acid-proof material and material which could easily receive radiation heat, could produce very good results.

In addition, electrophotographic photosensitive member produced by the method of forming photosensitive member according to the present invention could maintain good electric and image properties even after use for long period.

TABLE 10

| Substrate holder | Substrate holder material | Shape, dimension | Internal surface of substrate holder |
|---|---|---|---|
| 10A | JIS5000 series aluminum alloy | Fundamental structure of FIG. 1 Inside diameterø 92 mm Length 560 mm Center thickness 2 mm Auxiliary substrate length<br><br>Upper part 50 mm Lower part 160 mm | MgO Plasma spraying Thickness 50 µm |

TABLE 10-continued

| Substrate holder | Substrate holder material | Shape, dimension | Internal surface of substrate holder |
|---|---|---|---|
| | | Auxiliary substrate length | |
| | | Upper part 5 mm Lower part 5 mm | |
| 10B | ditto | ditto | $Al_2O_3$ Plasma spraying Thickness 50 μm |
| 10C | ditto | ditto | $Cr_2O_3$ Plasma spraying Thickness 50 μm |
| 10D | ditto | ditto | $Al_2O_3:Cr_2O_3$ =1:1 Plasma spraying Thickness 50 μm |
| 10E | ditto | ditto | Without ceramic coating JIS5000 series aluminum alloy |

TABLE 11

| Substrate in holder | Unevenness in chargeability | Unevenness in sensitivity | Unevenness in image density | White spots | Number of spherical projection | Over all evaluation |
|---|---|---|---|---|---|---|
| 10A | 81 | 81 | ⊚ | ⊚ | 74 | ⊚ |
| 10B | 79 | 80 | ⊚ | ⊚ | 62 | ⊚ |
| 10C | 68 | 62 | ⊚ | ⊚ | 73 | ⊚ |
| 10D | 64 | 58 | ⊚ | ⊚ | 61 | ⊚ |
| 10E | 100 | 100 | ○ | ○ | 100 | ○ |

TABLE 12

| Substrate in holder | Unevenness in chargeability | Unevenness in sensitivity | Unevenness in image density | Black spots | Number of spherical projection | Over all evaluation |
|---|---|---|---|---|---|---|
| 10A | 81/78 | 81/79 | ○/○ | ○ | 80 | ○ |
| 10B | 72/70 | 72/68 | ○/○ | ⊚ | 69 | ○~⊚ |
| 10C | 72/71 | 68/67 | ⊚/⊚ | ○ | 81 | ○~⊚ |
| 10D | 68/69 | 52/50 | ⊚/⊚ | ⊚ | 68 | ⊚ |
| 10E | 100/100 | 100/100 | Δ/Δ | Δ | 100 | Δ |

Note: before use/after use

EXPERIMENT 6

The surface of a cylindrical substrate of aluminum containing 100 ppm silicon atom was cut in the same procedures as described above for preparing electrophotographic photosensitive member according to the present invention. The dimensions of the substrate were 108 mm in diameter, 358 mm in length and 5 mm in thickness.

Fifteen minutes after the completion of cutting step, cleaning of substrate was done by using surface treatment apparatus shown in FIG. 2 under the conditions shown in Table 13. A for the detergent, the mixture of nonionic surfactant and anionic surfactant was employed.

Figure 7B:
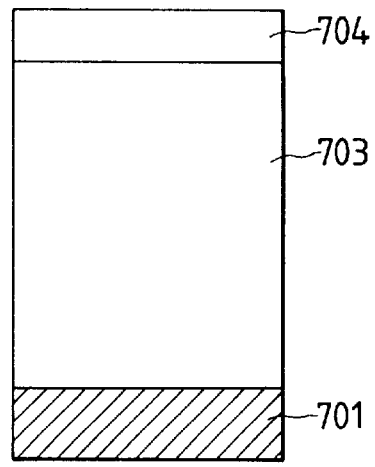

And then the cylindrical substrate was set on the substrate holder to form an amorphous silicon deposited film on the substrate under the condition of Table 14 by using apparatus for forming deposited film shown in FIGS. 5A and 5B and finally to make electrophotographic photosensitive member having layers whose structure was shown in FIG. 7B. In FIG. 7B, reference numerals 701, 703 and 704 shows respectively aluminum substrate, photoconductive layer and surface layer in order.

As the material of substrate holder, JIS 5000 series aluminum alloy was used. The internal surface of substrate holdr was coated with 100 mμ thick $TiO_2$ by arc flame spraying.

Electrophotographic photosensitive member prepared was set on an electrophotographic apparatus modified from NP-6060, a copying machine produced by Canon, for experiment. The characteristics of the electrophotograph evaluated were chargeability, chargeability unevenness, sensitivity, sensitivity unevenness, image density unevenness, and white spots.

Each item was evaluated in following method.
(1) Chargeability, chargeability unevenness
(2) Sensitivity, sensitivity unevenness
(3) Image density unevenness
(4) White spots Evaluation similar to that of Experiment 1 was made concerning each item above.

These evaluation results were shown in Table 15. In the Table, chargeability, chargeability unevenness, sensitivity, sensitivity unevenness were shown as relative evaluation in comparison with the results of Comparative example 1 shown below that were 100 or control.

COMPARATIVE EXAMPLE 1

The surface of a cylindrical substrate of aluminum containing 100 ppm silicon atom was cut in the same procedures as described above for preparing electrophotographic photosensitive member according to the present invention. The dimensions of the substrate were 108 mm in diameter, 358 mm in length and 5 mm in thickness.

Fifteen minutes after the completion of cutting step, triethane cleaning of substrate was done by using surface treatment apparatus shown in FIG. 8 under the conditions shown in Table 5.

Then the cylindrical substrate was set on the substrate holder to form an amorphous silicon deposited film on the substrate under the condition of Table 14 by using apparatus for forming deposited film shown in FIGS. 5A and 5B and finally to make electrophotographic photosensitive member having layers whose structure was shown in FIG. 7B.

As the material of substrate holder, JIS 5000 series aluminum alloy was used. No particular treatment was done on the internal surface of substrate holder.

Evaluation similar to that of Experiment 6 was given to electrophotographic photosensitive member.

These evaluation results together with those of Experiment 6 were shown in Table 15.

Electrophotographic photosensitive member produced by the method of producing electrophotographic photosensitive member according to the present invention could obtain very good result concerning any item in comparison with electrophotographic photosensitive member produced by the conventional method.

TABLE 13

| Treatment conditions | Pre-cleaning | Cleaning with aqueous carbon dioxide solution | Drying |
|---|---|---|---|
| | Aqueous detergent solution | Aqueous carbon dioxide solution (Conductivity: 10 μS/cm) | Air |
| Temperature | 30° C. | 20° C. | 80° C. |
| Pressure | | | 5 kg.f/cm² |
| Treating time | 3 min | 2 min | 1 min |
| Others | Ultrasonic treatment | | |

TABLE 14

| Layer name | Gas used and flow rate (sccm) | | μW Power (W) | Bias voltage (V) | Internal pressure (mTorr) | Substrate temperature (° C.) | Layer thickness |
|---|---|---|---|---|---|---|---|
| Photo conductive layer | SiH₄<br>CH₄<br>B₂H₆ 30→2 ppm<br>(Based on SiH₄)<br>SiF₄ 50→80 ppm<br>(Based on SiH₄)<br>He | 500<br>150→0<br><br><br><br><br>2000 | 1000 | 60 | 10 | 280 | 28 |
| Surface layer | SiH₄<br>SiF₄<br>CH₄ | 85<br>35<br>450 | 1000 | 80 | 10 | 280 | 0.5 |

TABLE 15

| | Charge ability | Unevenness in charge ability | Sensitivity | Unevenness in sensitivity | Unevenness in image density | white spots |
|---|---|---|---|---|---|---|
| Experiment 6 | 123 | 52 | 60 | 50 | ⊚ | ⊚ |
| Comparative Experiment 1 | 100 | 100 | 100 | 100 | Δ | Δ |

EXPERIMENT 7

The surface of a cylindrical substrate of aluminum containing 300 ppm silicon atom and 2 wt % magnesium atom was cut in the same procedures for preparing electrophotographic photosensitive member according to the present invention. The dimensions of the substrate were 80 mm in diameter, 358 mm in length and 5 mm in thickness.

Fifteen minutes after the completion of cutting step, cleaning of substrate was done by using surface treatment apparatus shown in FIG. 2 under the conditions shown in Table 13. As for the detergent, a nonionic surfactant was employed.

Figure 7C:
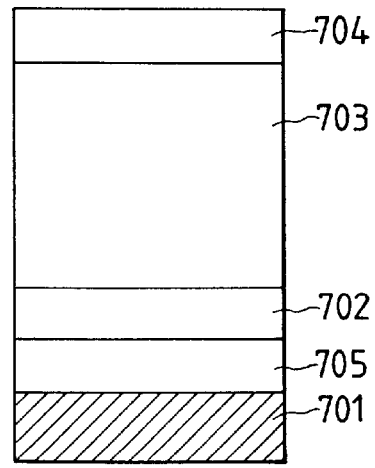

Then the cylindrical substrate was set on the substrate holder to form an amorphous silicon deposited film on the substrate under the condition of Table 16 by using deposited film formation apparatus shown in FIG. 4 and finally to form electrophotographic photosensitive member having layers whose structure was shown in FIG. 7C. In FIG. 7C, reference numerals 701, 705, 702, 703 and 704 denotes respectively aluminum substrate, layer absorbing infrared rays, charge blocking layer, photoconductive layer and surface layer in order.

As the material of substrate holder, JIS 5000 series aluminum alloy was used. The internal surface of substrate holder was plasma spray coated with the mixture of $Al_2O_3$ and $Cr_2O_3$ whose mass ratio was 1:1. Thickness of the coat was 100 μm.

Electrophotographic photosensitive member prepared was set on an electrophotographic apparatus modified from NP-9330, a copying machine produced by Canon, for, high speed experiment. The characteristics of the electrophotograph evaluated were chargeability, chargeability unevenness, sensitivity, sensitivity unevenness, image density unevenness, and black spots.

Each item was evaluated in following method.
(1) Chargeability, Chargeability Unevenness
    Evaluation similar to that of Experiment 1 was made.
(2) Sensitivity, Sensitivity Unevenness
    Electrophotographic photosensitive member was charged to have 410 V dark surface potential. An constant amount of light (1.4 μJ/cm²) was immediately irradiated on the electrophotographic photosensitive member. The light source was spot type 80 μm semiconductor laser (wavelength: 780 nm). At this time the bright surface potential of electrophotographic photosensitive member was measured by surface potential meter. Measurement of the bright surface potential was done at every 3 cm interval along one end of electrophotographic photosensitive member to the other end. Similar measurement was made at every 45 degree in 8 peripheral directions. The average value of the bright surface potential values measured is used as the value of sensibility and variance (standard deviation) as the value of sensibility unevenness.
(3) Image Density Unevenness
    Evaluation similar to that of Experiment 1 was made.
(4) Black Spots
    Unpainted white sheet was copied at first. Then black spots having diameter smaller than 0.2 mm in the same whole area of image copied were evaluated.
⊚—especially good
○—good
Δ—practically no problem
×—A problem or problems might practically occur depending on the case.

Above evaluation told that very good results were obtained concerning any item in this Experiment as well as in Experiment 6.

TABLE 16

| Layer name | Used gas and flow rate (sccm) | RF power (W) | Internal pressure (Torr) | Substrate temperature (°C.) | Layer thickness (μm) |
|---|---|---|---|---|---|
| Layer absorbing long wave light | SiH$_4$ 180<br>H$_2$ 300<br>B$_2$H$_6$ 1800 ppm<br>(Based on SiH$_4$)<br>NO 15<br>GeH$_4$ 100→0<br>(Varied linearly) | 300 | 0.3 | 270 | 1 |
| Charge blocking layer | SiH$_4$ 500<br>H$_2$ 300<br>B$_2$H$_6$ 1800 ppm<br>(Based on SiH$_4$)<br>No 8→0<br>(Varied linearly) | 300 | 0.3 | 270 | 3 |
| photo-conductive layer | SiH$_4$ 500<br>H$_2$ 300<br>B$_2$H$_6$ 0.2 ppm<br>(Based on SiH$_4$) | 500 | 0.3 | 270 | 20 |
| Surface layer | SiH$_4$ 50<br>CH$_4$ 600 | 300 | 0.4 | 270 | 0.5 |

It is needless to say that electrophotographic photosensitive member produced according to the present invention is not limited to structure shown in FIGS. 7A to 7C.

Take layer structure, for example, in FIGS. 7A to 7C, surface layer 704 and/or charge blocking layer 702 are not necessarily needed. Photoconductive layer 703 may be replaced by more than one layers such as, for example, charge transportation layer (CTL) and charge generation layer (CGL) instead of mono-layer structure.

As for the layer absorbing infrared rays 705, non-monocrystalline silicon containing silicon atom as the matrix and germanium atom or tin atom (such as a-SiGe, a-SiSn, etc.) and non-monocrystalline germanium containing germanium atom as the matrix (such as a-Ge etc.) are cited.

Another example is layer absorbing infrared rays 705, which may contain, for example, element or elements selected among Group III and Group V in the periodic table as substance for controlling conductivity.

As for charge blocking layer 702, non-monocrystal containing silicon atom as the matrix and element or elements selected among Group III or Group V in the periodic table as substance for controlling conductivity (such as amorphous silicon containing Group III or Group V in the periodic table a-Si (III), a-Si(V), etc.]) is preferable. As elements among Group III in the periodic table, boron (B), gallium (Ga) and indium (In) are preferably selected and among them boron (B) is most preferably selected. As elements among Group V in the periodic table, phosphorus (P), arsenic (As), antimony (Sb) and bismuth (Bi) are preferably selected and among them arsenic (As) is most preferably selected.

As for charge blocking layer 702, non-crystalline material containing silicon atom as the matrix and at least an element selected among oxygen (O), nitrogen (N) and carbon (C) may be appropriately used.

As for photoconductive layer 703, non-monocrystalline material containing silicon atom as the matrix, such as a-Si (amorphous silicon), is appropriately used, and in addition, a substance for controlling conductivity (Group III or Group V element in the periodic table), and/or at least an element selected from the group consisting of oxygen, nitrogen and carbon may be contained in the non-monocrystalline material as described above. It is ordinarily preferable that the quantities of these elements to be added, such as Group III or Group V element in the periodic table, oxygen, nitrogen and carbon, be less than the quantities required to function as charge blocking layer 702.

As for surface layer 704, non-monocrystalline material containing silicon atom as the matrix and at least an element selected among group consisting of oxygen, nitrogen and carbon may be appropriately used.

It is desirable that hydrogen atom and/or halogen atom be additionally contained in each layer.

Furthermore, in case that substance for controlling conductivity, oxygen, nitrogen, carbon, germanium and/or tin may additionally be contained in the non-monocrystalline material, uniformity may be maintained in the plane parallel to the support but may not necessarily be required in the direction of layer thickness.

These things like layer structure and contents of elements, etc. are appropriately determined depending on the required characteristics of electrophotographic photosensitive member.

As described above, in the manufacturing method for an electrophotographic photosensitive member comprising a step for forming a functional film on an aluminum substrate, particularly in the manufacturing method for an electrophotographic photosensitive member comprising a step for forming a non-monocrystalline deposited film comprising one or both of hydrogen atoms and fluorine atoms, and silicon atoms on the aluminum substrate by the plasma CVD method, according to the present invention, by using the substrate of which surface is cleaned with water in which carbon dioxide is dissolved, and by using the substrate holder having formed ceramics at least on the inner surface, it is possible to economically and stably manufacture an electrophotographic photosensitive member which provides high quality images.

What is claimed is:

1. A method for manufacturing an electrophotographic photosensitive member comprising a photoconductive film of non-monocrystalline material comprising silicon on a cylindrical aluminum substrate having an inner surface, which comprises in sequence:

(a) cleaning an outer surface of the cylindrical aluminum substrate with water containing dissolved carbon dioxide such that a conductivity of the water is from 2 μS/cm to 40 μS/cm;

(b) fitting the inner surface of the cylindrical aluminum substrate over a repeatedly usable substrate holder, the substrate holder having at least (i) a cylindrical outer surface for receiving the cylindrical aluminum substrate, (ii) a hollow cylindrical core comprising a metal, wherein a surface only of the hollow portion of the core is ceramic having a ten points average roughness (Rz) between 5 and 200 μm and the metal is in contact with the ceramic; and (c) forming by chemical vapor deposition (CVD) on the outer surface of the cylindrical aluminum substrate the photoconductive film comprising the non-monocrystalline material comprising silicon atoms thereby forming the electrophotographic photosensitive member.

2. The method according to claim 1, wherein a pH of said water in which the carbon dioxide is dissolved is from 3.8 to 6.0.

3. The method according to claim 1, wherein said water in which the carbon dioxide is dissolved is made up by dissolving the carbon dioxide in water having an electrical resistivity of 1 MΩ·cm or higher.

4. The method according to claim 1, wherein said aluminum substrate also contains at least silicon atoms.

5. The method according to claim 4, wherein said aluminum substrate also contains at least silicon atoms of 1 ppm by weight to 1 wt %.

6. The method according to claim 1, wherein said ceramic is a material having corrosion resistance to gases employed in said chemical vapor deposition during step (c).

7. The method according to claim 6, wherein said ceramic is selected from the group consisting of at least one of $Al_2O_3$, $TiO_2$ and $SiO_2$.

8. The method according to claim 1, wherein said ceramic transmits heat.

9. The method according to claim 8, wherein said ceramic is $Cr_2O_3$.

10. The method according to claim 1, wherein said water in which the carbon dioxide is dissolved has an electrical resistivity of from 1 MΩ·cm to 17 MΩ·cm at a water temperature of 25° C., and contains 10000 pieces or less of fine particles of 0.2 μm or more in diameter per milliliter, 100 microbes or less in the total number per milliliter and 10 mg or less of organic substances per milliliter.

11. The method according to claim 1 wherein said water in which the carbon dioxide is dissolved is at a temperature from 10° C. to 90° C.

12. The method according to claim 1, wherein the cleaning with said water in which the carbon dioxide is dissolved is carried out by dipping.

13. The method according to claim 1, wherein the cleaning with said water in which the carbon dioxide is dissolved is carried out by blowing.

14. The method according to claim 13, wherein said blowing is conducted at a water pressure from 2 kg·f/cm² to 300 kg·f/cm².

15. The method according to claim 13, wherein said blowing is conducted employing from 1 ml/min to 200 l/min of said water.

16. The method according to claim 13, wherein said water in which the carbon dioxide is dissolved is at a temperature from 5° C. to 90° C.

17. The method according to claim 1, wherein the cleaning with said water in which the carbon dioxide is dissolved is conducted during a time period from 10 seconds to 30 minutes.

18. The method according to claim 1, further comprising an initial cleaning step before the cleaning with said water containing dissolved carbon dioxide.

19. The method according to claim 1, wherein said water in which the carbon dioxide is dissolved contains carbon dioxide at 60% or less by volume of a saturated quantity.

20. The method according to claim 18, wherein said initial cleaning step is carried out using a water different from the water containing dissolved carbon dioxide.

21. The method according to claim 20, wherein said water different from the water containing dissolved carbon dioxide contains a surface active agent.

22. The method according to claim 20, wherein said water different from the water containing dissolved carbon dioxide has an electrical resistivity of from 1 MΩ·cm to 17 MΩ·cm at a water temperature of 25° C., and contains 10,000 pieces or less of fine particles of 0.2 μm or more in diameter per milliliter, 100 microbes or less in total number per milliliter and 10 mg or less of organic substances per milliliter.

23. The method according to claim 20, wherein said water different from the water containing dissolved carbon dioxide is at a temperature from 10° C. to 90° C.

24. The method according to claim 21, wherein said surface active agent is at least one selected from the group consisting of an anionic surface active agent, a cationic surface active agent, a nonionic surface active agent and an amphoteric surface active agent.

25. The method according to claim 18, wherein said initial cleaning step further uses ultrasonic waves.

26. The method according to claim 25, wherein said ultrasonic waves have a frequency of from 100 Hz to 10 MHz.

27. The method according to claim 25, wherein said ultrasonic waves have an output of from 0.1 W/liter to 1 KW/liter.

28. The method according to claim 1, further comprising a step of cutting said substrate before said cleaning step with the water in which the carbon dioxide is dissolved.

29. The method according to claim 28, wherein a period from said cutting step to said cleaning step with the water in which the carbon dioxide is dissolved is from one minute to 16 hours.

30. The method according to claim 1, wherein said substrate is fed into a deposited film forming apparatus for forming said photoconductive film within a time of from one minute to 16 hours after said cleaning step with the water in which the carbon dioxide is dissolved.

31. The method according to claim 1, further comprising a drying step after said cleaning step with water in which carbon dioxide is dissolved.

32. The method according to claim 31, wherein the drying of the drying step is selected from the group consisting of: heated air drying, and vacuum drying.

33. The method according to claim 31, wherein said drying step is carried out permitting the substrate to dry by evaporation after applying hot water at a temperature of 30–90° C. in which carbon dioxide is dissolved, said hot water being different from the water employed in the cleaning step.

34. The method according to claim 33, wherein said water at 30° C. to 90° C. in which the carbon dioxide is dissolved is a water which has an electrical resistivity of from 1 MΩ·cm to 17 MΩ·cm at a water temperature of 25° C., and contain 10000 pieces or less of fine particles of 0.2 μm or more in diameter per milliliter, 100 microbes or less in the total number per milliliter and 10 mg or less of org is substances per milliliter.

35. The method according to claim 33, wherein said carbon dioxide is contained in water at 60% or less of a saturated solubility.

36. The method according to claim 33, wherein said hot water has a conductivity of from 2 μS/cm to 40 μS/cm.

37. The method according to claim 33, wherein said water at a temperature of 30° C. to 90° C. has a pH of from 3.8 to 6.0.

38. The method according to claim 1, wherein said aluminum substrate also comprises magnesium atoms.

39. The method according to claim 38, wherein said magnesium atoms are present in amounts from 0.1 wt % to 10 wt %.

40. The method according to claim 1, wherein said non-monocrystalline film, comprises at least one material selected from the group consisting of amorphous silicon, amorphous germanium silicon or amorphous silicon carbide.

41. The method according to claim 1, wherein said film comprises a photoconductive layer.

42. The method according to claim 41, wherein said film has at least one other layer selected from the group consisting of (a) a charge injection blocking layer provided on the substrate side of the photoconductive layer, (b) an infrared light absorbing layer provided on the substrate side of the photoconductive layer and (c) a surface layer provided on the side opposite to the substrate side of the photoconductive layer.

43. The method according to claim 1, wherein said CVD is Rf plasma CVD or microwave plasma CVD.

44. The method according to claim 1, wherein said film has a thickness of from 5 µm to 100 µm.

45. The method according to claim 43, wherein said film is formed under a pressure of from $1\times10^{-3}$ Torr to $1\times10^{-1}$ Torr.

46. The method according to claim 43, wherein said film is formed at a substrate temperature of from 100° C. to 500° C.

47. The method according to claim 20, wherein said water is water different from the water containing dissolved carbon dioxide is water in which carbon dioxide is dissolved.

48. The method according to claim 47, wherein said water different from the water containing dissolved carbon dioxide contains a surface active agent.

49. The method according to claim 1, wherein said metal is aluminum or an aluminum alloy.

50. A method for manufacturing an electrophotographic photosensitive member comprising a photoconductive film of non-monocrystalline material comprising silicon on a cylindrical aluminum substrate having an inner surface, which comprises in sequence:

(a) precleaning a surface of the cylindrical aluminum substrate with water containing a detergent;

(b) cleaning the surface of the cylindrical aluminum substrate with water containing dissolved carbon dioxide such that a conductivity of the water is from 2 µS/cm to 40 µS/cm;

(c) fitting the inner surface of the cylindrical aluminum substrate over a repeatedly usable substrate holder, the substrate holder having at least (i) a cylindrical outer surface for receiving the cylindrical aluminum substrate, (ii) a hollow cylindrical core comprising a metal, wherein a surface only of the hollow portion of the core is ceramic and the metal is in contact with the ceramic; and (d) forming by chemical vapor deposition (CVD) on the surface of the cylindrical aluminum substrate the photoconductive film comprising the non-monocrystalline material comprising silicon atoms thereby forming the electrophotographic photosensitive member.

* * * * *

UNITED STATES PATENT AND TRADEMARK OFFICE
CERTIFICATE OF CORRECTION

PATENT NO. : 6,391,394 B1
DATED : May 21, 2002
INVENTOR(S) : Toshiyasu Shirasuna et al.

It is certified that error appears in the above-identified patent and that said Letters Patent is hereby corrected as shown below:

Title page,
Item [56], References Cited, OTHER PUBLICATIONS, after "The Oxford Dictionary", "Per" should read -- for -- and "Clarenden" should read -- Clarendon -- and "No Month)" should read -- no month) --; and after "Webster's 9th New Collegiate Dictionary", "exceprts" should read -- excerpts, -- and after "E.M. Purcell, Electricity & Magnetism: Berkeley", "Physic" should read -- Physics -- and "exceprts," should read -- excerpts, --.

Column 1,
Line 40, "a obtain" should read -- obtain a --.

Column 2,
Line 14, "on" should read -- on the -- and "of" should read -- of the --;
Line 52, "as" should read -- as a --; and
Line 66, "as" should read -- as a --.

Column 3,
Line 1, "has" should read -- has the --;
Line 3, "micro wave" should read -- microwave --;
Line 12, "is to" should read -- is used to --;
Line 21, "electrode" should read -- an electrode --;
Line 25, "case" should read -- case wherein an --;
Line 30, "on lathe with" should read -- on a lathe with an --; and
Line 52, "of" should read -- of the --.

Column 4,
Line 14, "is" should read -- are --;
Line 32, "subs ate" should read -- substrate --;
Line 35, "of" should read -- of the --;
Line 57, "requested" should read -- required --; and
Line 61, "requested" should read -- required --.

Column 5,
Line 6, "system" should read -- systems --;
Line 19, "machine" should read -- machines --;
Line 22, "machine" should read -- machines --;
Line 45, "result" should read -- result in --;
Line 50, "another" should be deleted; and
Line 62, "another" should be deleted.

UNITED STATES PATENT AND TRADEMARK OFFICE
CERTIFICATE OF CORRECTION

PATENT NO. : 6,391,394 B1
DATED : May 21, 2002
INVENTOR(S) : Toshiyasu Shirasuna et al.

It is certified that error appears in the above-identified patent and that said Letters Patent is hereby corrected as shown below:

Column 6,
Line 51, "substrate" should read -- substrates --.

Column 7,
Lines 3-4, "phenomenon" should read -- phenomena --;
Line 23, "characteristic." should read -- characteristics. --;
Line 26, "electrograhic" should read -- electrophotographic --;
Line 31, "inhibitor" should read -- inhibitors --; but should also delete "is"
Line 33, "do," should read -- does, --;
Line 36, "electrograhic" should read -- electrophotographic --;
Line 46, "Area" should read -- An area -- and "atom" should read -- atoms --;
Line 51, "these" should read -- this --;
Line 57, "atom." should read -- atoms. --; and
Line 63, "electrograhic" should read -- electrophotographic --.

Column 8,
Line 6, "inside" should read -- the inside --;
Line 20, "These" should read -- This --;
Line 57, "is" should read -- are --; and
Line 66, "little cause" should read -- cause little --.

Column 9,
Line 36, "is" should read -- are --.

Column 10,
Line 28, "results" should read -- results in -- and
Line 52, "another" should read -- other --.

Column 11,
Line 19, "occurrence" should read -- occurrences --.

Column 13,
Line 3, "vessel" (second occurrence) should be deleted;
Line 9, "a exhausting" should read -- an exhausting --;
Line 18, "cylinderical" should read -- cylindrical --;
Line 47, "though" should read -- through --; and
Line 50, "is" should be deleted.

UNITED STATES PATENT AND TRADEMARK OFFICE
CERTIFICATE OF CORRECTION

PATENT NO. : 6,391,394 B1
DATED : May 21, 2002
INVENTOR(S) : Toshiyasu Shirasuna et al.

It is certified that error appears in the above-identified patent and that said Letters Patent is hereby corrected as shown below:

Column 14,
Line 61, "vessel" (second occurrence) should be deleted and "vessel" (first occurrence) should read -- vessel 301 --.

Column 15,
Line 3, "a exhausting" should read -- an exhausting --;
Line 7, "ceramics" should read -- ceramic --; and
Line 46, "is" should be deleted.

Column 16,
Line 32, "lower" should read -- lower than --.

Column 17,
Line 13, "condutive" should read -- conductive --; and
Line 14, "preferably" should read -- preferable --.

Column 18,
Line 18, "13 Ω•cm" should read -- 13 MΩ•cm --.

Column 22,
Line 11, "is" should be deleted.

Column 24,
Line 6, "bellow" should read -- below -- and "referring" should read -- referring to --.

Column 25,
Line 63, "degree" should read -- degrees --.

Column 26,
Line 13, "degree" should read -- degrees --.

Column 29,
Line 16, "amount" should read -- amounts --.

UNITED STATES PATENT AND TRADEMARK OFFICE
CERTIFICATE OF CORRECTION

PATENT NO.   : 6,391,394 B1
DATED        : May 21, 2002
INVENTOR(S)  : Toshiyasu Shirasuna et al.

It is certified that error appears in the above-identified patent and that said Letters Patent is hereby corrected as shown below:

Column 31,
Line 4, "the" should be deleted.
Line 5, "each" should read -- each of --;
Line 6, "by" should read -- by the --; and
Line 7, "kept" should read -- kept at --.

Column 32,
Line 14, "be" should read -- been --.

Column 33,
Table 11, "Substrate in holder" should read -- Substrate holder --; and
Table 12, "Substrate in holder" should read -- Substrate holder --.

Column 34,
Line 1, "A for" should read -- As for --; and
Line 14, "holdr" should read -- holder --.

Column 36,
Line 39, "An" should read -- A --; and
Line 48, "degree" should read -- degrees --.

Column 37,
Table 16, "Used gas" should read -- Gas Used --; and
Line 51, "etc.])" should read -- etc.) --.

Column 40,
Line 12, "output" should read -- energy density -- and "W/liter" should read
-- Watts/liter --;
Line 13, "KW/liter." should read -- Kilowatt/liter. --;
Line 42, "contain" should read -- contains --;
Line 44, "org is" should read -- organic --; and
Line 60, "film," should read -- film --.

UNITED STATES PATENT AND TRADEMARK OFFICE
CERTIFICATE OF CORRECTION

PATENT NO.    : 6,391,394 B1
DATED         : May 21, 2002
INVENTOR(S)   : Toshiyasu Shirasuna et al.

It is certified that error appears in the above-identified patent and that said Letters Patent is hereby corrected as shown below:

Column 41,
Line 17, "is water" should be deleted.

Signed and Sealed this

Twenty-ninth Day of October, 2002

Attest:

JAMES E. ROGAN
Attesting Officer

Director of the United States Patent and Trademark Office